US007657856B1

(12) United States Patent
Koshy et al.

(10) Patent No.: US 7,657,856 B1
(45) Date of Patent: Feb. 2, 2010

(54) METHOD AND SYSTEM FOR PARALLEL PROCESSING OF IC DESIGN LAYOUTS

(75) Inventors: Mathew Koshy, San Mateo, CA (US); Roland Ruehl, San Carlos, CA (US); Min Cao, San Ramon, CA (US); Li-Ling Ma, San Jose, CA (US); Eitan Cadouri, Cupertino, CA (US); Tianhao Zhang, Raleigh, NC (US)

(73) Assignee: Cadence Design Systems, Inc., San Jose, CA (US)

( * ) Notice: Subject to any disclaimer, the term of this patent is extended or adjusted under 35 U.S.C. 154(b) by 19 days.

(21) Appl. No.: 11/520,487

(22) Filed: Sep. 12, 2006

(51) Int. Cl.
*G06F 17/50* (2006.01)

(52) U.S. Cl. .................... 716/7; 716/8; 716/21; 703/16

(58) Field of Classification Search ..................... 716/8, 716/21, 7; 703/16
See application file for complete search history.

(56) References Cited

U.S. PATENT DOCUMENTS

| | | | | |
|---|---|---|---|---|
| 5,581,475 | A * | 12/1996 | Majors | 716/10 |
| 5,828,880 | A | 10/1998 | Hanko | |
| 5,870,313 | A | 2/1999 | Boyle et al. | |
| 6,003,066 | A | 12/1999 | Ryan et al. | |
| 6,009,250 | A | 12/1999 | Ho et al. | |
| 6,035,107 | A | 3/2000 | Kuehlmann et al. | |
| 6,047,116 | A * | 4/2000 | Murakami et al. | 716/19 |
| 6,066,179 | A | 5/2000 | Allan | |
| 6,185,583 | B1 | 2/2001 | Blando | |
| 6,237,128 | B1 | 5/2001 | Folberth et al. | |
| 6,289,369 | B1 | 9/2001 | Sundaresan | |
| 6,324,673 | B1 * | 11/2001 | Luo et al. | 716/11 |
| 6,389,451 | B1 | 5/2002 | Hart | |
| 6,505,327 | B2 | 1/2003 | Lin | |
| 6,519,749 | B1 | 2/2003 | Chao et al. | |
| 6,536,028 | B1 | 3/2003 | Katsioulas et al. | |
| 6,560,766 | B2 | 5/2003 | Pierrat et al. | |
| 6,574,788 | B1 | 6/2003 | Levine et al. | |
| 6,629,293 | B2 | 9/2003 | Chang et al. | |
| 6,701,504 | B2 | 3/2004 | Chang et al. | |
| 6,721,928 | B2 | 4/2004 | Pierrat et al. | |
| 6,738,954 | B1 * | 5/2004 | Allen et al. | 716/4 |

(Continued)

OTHER PUBLICATIONS

Office Action dated Jan. 11, 2008 for U.S. Appl. No. 11/228,472.

(Continued)

*Primary Examiner*—Phallaka Kik
(74) *Attorney, Agent, or Firm*—Vista IP Law Group, LLP

(57) ABSTRACT

Disclosed is a method and system for processing the tasks performed by an IC layout processing tool in parallel. In some approaches, the IC layout is divided into a plurality of layout portions and one or more of the layout portions are processed in parallel, where geometric select operations are performed in which data for different layout portions may be shared between different processing entities. One approach includes the following actions: select phase one operation for performing initial select actions within layout portions; distributed regioning action for local regioning; distributed regioning action for global regioning and binary select; count select aggregation for count-based select operations; and select phase two operations for combining results of selecting of internal shapes and interface shapes.

28 Claims, 24 Drawing Sheets

U.S. PATENT DOCUMENTS

| | | | | |
|---|---|---|---|---|
| 6,829,757 | B1 * | 12/2004 | Teig et al. | 716/12 |
| 6,996,790 | B2 | 2/2006 | Chang | |
| 7,047,506 | B2 | 5/2006 | Neves et al. | |
| 7,051,307 | B2 | 5/2006 | Ditlow et al. | |
| 7,089,511 | B2 | 8/2006 | Allen et al. | |
| 7,107,559 | B2 | 9/2006 | Lakshmanan et al. | |
| 7,155,698 | B1 | 12/2006 | Gennari | |
| 7,177,859 | B2 | 2/2007 | Pather et al. | |
| 7,266,795 | B2 | 9/2007 | Baumgartner et al. | |
| 7,318,214 | B1 * | 1/2008 | Prasad et al. | 716/21 |
| 7,340,742 | B2 | 3/2008 | Tabuchi | |
| 7,401,208 | B2 | 7/2008 | Kalla et al. | |
| 7,421,505 | B2 | 9/2008 | Berg | |
| 7,500,217 | B2 * | 3/2009 | Cote et al. | 716/19 |
| 2001/0003843 | A1 | 6/2001 | Scepanovic et al. | |
| 2002/0049956 | A1 | 4/2002 | Bozkus et al. | |
| 2003/0012147 | A1 | 1/2003 | Buckman et al. | |
| 2003/0023939 | A1 | 1/2003 | Pierrat et al. | |
| 2003/0037117 | A1 | 2/2003 | Tabuchi | |
| 2004/0015256 | A1 | 1/2004 | Conrad et al. | |
| 2004/0019679 | A1 | 1/2004 | E et al. | |
| 2004/0019892 | A1 | 1/2004 | E et al. | |
| 2004/0044979 | A1 | 3/2004 | Aji et al. | |
| 2004/0098511 | A1 | 5/2004 | Lin et al. | |
| 2004/0199887 | A1 | 10/2004 | Jain et al. | |
| 2004/0268354 | A1 | 12/2004 | Kanai et al. | |
| 2005/0038852 | A1 | 2/2005 | Howard | |
| 2005/0091634 | A1 | 4/2005 | Gallatin et al. | |
| 2005/0097561 | A1 | 5/2005 | Schumacher et al. | |
| 2005/0102681 | A1 | 5/2005 | Richardson | |
| 2005/0132320 | A1 * | 6/2005 | Allen et al. | 716/18 |
| 2005/0138474 | A1 | 6/2005 | Jain et al. | |
| 2005/0166173 | A1 * | 7/2005 | Cote et al. | 716/19 |
| 2005/0216870 | A1 | 9/2005 | DeCamp et al. | |
| 2005/0216875 | A1 | 9/2005 | Zhang et al. | |
| 2005/0262510 | A1 | 11/2005 | Parameswaran et al. | |
| 2006/0062430 | A1 | 3/2006 | Vallone et al. | |
| 2006/0123420 | A1 | 6/2006 | Nishikawa | |
| 2006/0230370 | A1 | 10/2006 | Baumgartner et al. | |
| 2006/0265675 | A1 | 11/2006 | Wang | |
| 2007/0079268 | A1 | 4/2007 | Jones et al. | |
| 2007/0192545 | A1 | 8/2007 | Gara et al. | |
| 2007/0220232 | A1 | 9/2007 | Rhoades et al. | |
| 2007/0233805 | A1 | 10/2007 | Grodd et al. | |
| 2007/0271562 | A1 | 11/2007 | Schumacher et al. | |
| 2009/0125867 | A1 * | 5/2009 | Cote et al. | 716/19 |

OTHER PUBLICATIONS

Office Action dated Aug. 24, 2007 for U.S. Appl. No. 11/228,472.
Office Action dated Jan. 18, 2007 for U.S. Appl. No. 11/228,472.
Office Action dated Sep. 28, 2007 for U.S. Appl. No. 11/225,816.
Office Action dated Sep. 7, 2007 for U.S. Appl. No. 11/225,853.
Office Action dated Mar. 9, 2007 for U.S. Appl. No. 11/225,853.
Office Action dated Sep. 17, 2007 for U.S. Appl. No. 11/225,815.
Bender, M.A. et al. "On-the-Fly Maintenance of Series-Parallel Relationships in Fork-Join Multithreaded Programs" Proceedings of the 16th Annual ACM Symposium on Parallelism in Algorithms and Architectures, Barcelona, Spain, 2004, pp. 133-144.
Cadence Design Systems, Inc. "Assura Layout vs. Schematic Verifier" 2003, 4 pgs., Cadence Design Systems, Inc., San Jose, CA.
Ferguson, J. "Calibre MTflex: Reducing the High Cost of Processing Power", Mar. 2004, 5 pgs., Mentor Graphics Corporation, San Jose, CA.
Fliesler, M. "Mentor Consulting Helps AMD Win Another Race to Market", 2001, pp. 1-5, Mentor Graphics Corporation, San Jose, CA.
Kalas, I. et al. "FTL: A Multithreaded Environment for Parallel Computation" Proceedings of the 1994 Conference of the Centre for Advanced Studies on Collaborative Research, Toronto, Ontario, Canada, 1994, pp. 1-12.
Krishnaswamy, V. et al. "Actor Based Parallel VHDL Simulation Using Time Warp" Proceedings of the 10th Workshop on Parallel and Distributed Simulation, 1996, pp. 135-142.
Lee, P.M. et al. "A Parallel and Accelerated Circuit Simulator with Precise Accuracy" Proceedings of the 15th International Conference on VLSI Design (VLSI '02), Bangalore, India, Jan. 7-11, 2002, pp. 1-6.
Magarshack, P. et al. "System-on-Chip Beyond the Nanometer Wall" Proceedings of the 40th Conference on Design Automation (DAC '03), Anaheim, CA, Jun. 2-6, 2003, pp. 419-424.
Mentor Graphics Corporation "Mentor Graphics Unveils Calibre MTflex to Combat Cost of Nanometer Design Compute Requirements", May 12, 2003, 2 pgs., Mentor Graphics Corporation, San Jose, CA.
Mentor Graphics Corporation "Calibre LVS: Precise IC Layout Verification with the Schematic Design", 2005, 4 pgs., Mentor Graphics Corporation, San Jose, CA.
Prabhu, A.M. "Management Issues in EDA" Proceedings of the 31st Conference on Design Automation (DAC '94), San Diego, CA, Jun. 6-10, 1994, pp. 41-47.
Saavedra-Barrera, R.H. et al. "Analysis of Multithreaded Architectures for Parallel Computing" Proceedings of the Second Annual ACM Symposium on Parallel Algorithms and Architectures (SPAA '90), Island of Crete, Greece, 1990, pp. 169-178.
Schellenberg, F. "Mask EDA Workshop" Copyright 1999-2001, 47 pgs., Mentor Graphics Corporation, San Jose, CA.
Spiller, M.D. et al. "EDA and the Network" Proceedings of the 1997 IEEE/ACM International Conference on Computer-Aided Design (CAD '97), San Jose, CA, 1997, pp. 470-476.
Office Action dated Jun. 11, 2008 for U.S. Appl. No. 11/225,853.
Office Action dated Apr. 8, 2008 for U.S. Appl. No. 11/225,816.
Banicescu, I. et al. "Overhead Analysis of a Dynamic Load Balancing Library for Cluster Computing" Proceedings of the 19th IEEE International Parallel and Distributed Processing Symposium (IPDPS'05), IEEE, 2005, p. 1.
Cadence Design Systems, Inc. "Diva Reference" Product Version 4.4.6, Jun. 2000, Cadence Design Systems, Inc. San Jose CA., part 1 of 14, pp. 1-49.
Cadence Design Systems, Inc. "Diva Reference" Product Version 4.4.6, Jun. 2000, Cadence Design Systems, Inc. San Jose CA., part 2 of 14, pp. 50-99.
Cadence Design Systems, Inc. "Diva Reference" Product Version 4.4.6, Jun. 2000, Cadence Design Systems, Inc. San Jose CA., part 3 of 14, pp. 100-149.
Cadence Design Systems, Inc. "Diva Reference" Product Version 4.4.6, Jun. 2000, Cadence Design Systems, Inc. San Jose CA., part 4 of 14, pp. 150-199.
Cadence Design Systems, Inc. "Diva Reference" Product Version 4.4.6, Jun. 2000, Cadence Design Systems, Inc. San Jose CA., part 5 of 14, pp. 200-249.
Cadence Design Systems, Inc. "Diva Reference" Product Version 4.4.6, Jun. 2000, Cadence Design Systems, Inc. San Jose CA., part 6 of 14, pp. 250-299.
Cadence Design Systems, Inc. "Diva Reference" Product Version 4.4.6, Jun. 2000, Cadence Design Systems, Inc. San Jose CA., part 7 of 14, pp. 300-349.
Cadence Design Systems, Inc. "Diva Reference" Product Version 4.4.6, Jun. 2000, Cadence Design Systems, Inc. San Jose CA., part 8 of 14, pp. 350-399.
Cadence Design Systems, Inc. "Diva Reference" Product Version 4.4.6, Jun. 2000, Cadence Design Systems, Inc. San Jose CA., part 9 of 14, pp. 400-449.
Cadence Design Systems, Inc. "Diva Reference" Product Version 4.4.6, Jun. 2000, Cadence Design Systems, Inc. San Jose CA., part 10 of 14, pp. 450-499.
Cadence Design Systems, Inc. "Diva Reference" Product Version 4.4.6, Jun. 2000, Cadence Design Systems, Inc. San Jose CA., part 11 of 14, pp. 500-549.
Cadence Design Systems, Inc. "Diva Reference" Product Version 4.4.6, Jun. 2000, Cadence Design Systems, Inc. San Jose CA., part 12 of 14, pp. 550-599.

Cadence Design Systems, Inc. "Diva Reference" Product Version 4.4.6, Jun. 2000, Cadence Design Systems, Inc. San Jose CA., part 13 of 14, pp. 600-629.

Cadence Design Systems, Inc. "Diva Reference" Product Version 4.4.6, Jun. 2000, Cadence Design Systems, Inc. San Jose CA., part 14 of 14, pp. 630-658.

Dongarra, J.J. et al. "LAPACK Working Note 37 Two Dimensional Basic Linear Algebra Communication Subprograms" Technical Report University of Tennessee, 1991, 8 pages.

Mohapatra, P. et al. "A Lazy Scheduling Scheme for Hypercube Computers" Journal Of Parallel and Distributed Computing, 1995, pp. 26-37.

Niewczas, M. et al. "A Pattern Matching Algorithm for Verification and Analysis of Very Large IC Layouts" ISPD 98, Apr. 6-8, 1998, pp. 129-134.

Ousterhout J.K. "Corner Stitching: A Data-Structure Technique fro VLSI Layout Tools" IEEE Transactions on Computer Aided-Design of Integrated Circuits and Systems, vol. CAD-3, No. 1, pp. 97-100, Jan. 1984.

Teo, Y.M. et al. "A compensation-based scheduling scheme for Grid Computing" Proceeding of the 7th International Conference on High Performance Computing and Grid, pp. 334-342, IEEE Computer Society Press, Tokyo, Japan, Jul. 20-22, 2004.

Notice of Allowance dated Mar. 11, 2008 for U.S. Appl. No. 11/225,815.

Office Action dated Feb. 18, 2009 for U.S. Appl. No. 11/228,472.

Office Action dated Jan. 2, 2009 for U.S. Appl. No. 11/225,853.

Office Action dated Dec. 18, 2008 for U.S. Appl. No. 11/225,816.

Final Office Action dated Jan. 2, 2009 for U.S. Appl. No. 11/225,853.

Scherber et al., PALACE: A parallel and hierarchical layout analyzer and cirucite extractor, Mar. 1996, European Design and Test Conference.

Final Office Action dated Aug. 13, 2009 for U.S. Appl. No. 11/228,472.

* cited by examiner

COMPUTATIONAL MODEL

```
Procedure globalRegioningInEachWindow( x,y)
{
  Variable localGraph;
  Variable sendBuf;
  Variable rcvBuf;

  localGraph = Compute the local connected-component graph in the given window;

  // Copy localGraph to sendBuf
  sendBuf←localGraph;
  // horizontal aggregation
  for ( i= 1; i < N; i++ ){
     // send the data in sendBuf to its right-side neighbor
     sendDataToNeighbor( x+1, y, sendBuf );
     // receive the data from its left-side neighbor, and put it in rcvBuf
     receiveDataFromNeighbor( x-1,y, rcvBuf );
     // aggregate with neighbor graph
1102 localGraph←aggregateGraph( localGraph, rcvBuf );
     // pass the data received to the sendBuf
     sendBuf←rcvBuf;
  }

  // Copy localGraph to sendBuf
  sendBuf←localGraph;

  // vertical aggregation
  for ( j=1; j< M; j++ ){
   // send the data in sendBuf to its top-side neighbor
   sendDataToNeighbor( x, y+1, sendBuf );
   // receive the data from its bottom-side neighbor, and put it in rcvBuf
1104 receiveDataFromNeighbor(x, y-1, rcvBuf );
   // aggregate with neighbor graph
   localGraph←aggregateGraph( localGraph, rcvBuf );
   // pass the data received to the sendBuf
   sendBuf← rcvBuf;
  }
}
```

FIG. 11

Local regioning result. The number inside each node is the local region number. The 1/0 shown next to each node is the local select result. 1/0 means the region is selected/not selected locally.

Global regioning and binary select after the horizontal aggregation. Note that each node within the same disjoint set has the same flag.

Global regioning and binary select after vertical aggregation. Note that after this aggregation, all the nodes form one disjoint set. Each node has the identical flag value 1 which means that the layerA interface shape in each window is selected globally.

METHOD AND SYSTEM FOR PARALLEL PROCESSING OF IC DESIGN LAYOUTS

BACKGROUND AND SUMMARY

The invention relates to the design and manufacture of integrated circuits, and more particularly, to systems and methods for performing physical verification during the circuit design process.

The electronic design process for an integrated circuit (IC) involves describing the behavioral, architectural, functional, and structural attributes of an IC or electronic system. Design teams often begin with very abstract behavioral models of the intended product and end with a physical description of the numerous structures, devices, and interconnections on an IC chip. Semiconductor foundries use the physical description to create the masks and test programs needed to manufacture the ICs.

A Physical Verification (PV) tool is a common example of an EDA tool that is used by electronics designers. PV is one of the final steps that is performed before releasing an IC design to manufacturing. Physical verification ensures that the design abides by all of the detailed rules and parameters that the foundry specifies for its manufacturing process. Violating a single foundry rule can result in a silicon product that does not work for its intended purpose. Therefore, it is critical that thorough PV processing is performed before finalizing an IC design. Physical Verification tools may be used frequently and at many stages of the IC design process. PV tools may be used during design and at tape-out to ensure compliance with physical and electrical constraints imposed by the manufacturing process. In addition, PV tools may also be used after tape-out to verify and ensure manufacturability of the design and its constituent elements.

PV tools read and manipulate a design database which stores information about device geometries and connectivity. Because compliance with design rules generally constitutes the gating factor between one stage of the design and the next, PV tools are typically executed multiple times during the evolution of the design and contribute significantly to the project's critical path. Therefore, reducing PV tool execution time makes a major contribution to the reduction of overall design cycle times.

As the quantity of data in modern IC designs become larger and larger over time, the execution time required to process EDA tools upon these IC designs also becomes greater. For example, the goal of reducing PV tool execution time is in sharp tension with many modern IC designs being produced by electronics companies that are constantly increasing in complexity and number of transistors. The more transistors and other structures on an IC design, the greater amounts of time that is normally needed to perform PV processing. This problem is exacerbated for all EDA tools by constantly improving IC manufacturing technologies that can create IC chips at ever-smaller feature sizes, which allows increasingly greater quantities of transistors to be placed within the same chip area, as well resulting in more complex physical and lithographic effects during manufacture.

To achieve faster results, it is therefore desirable to perform EDA processing upon an IC layout using multi-processing approaches, e.g., concurrent or parallel processing. Examples of systems that support parallel processing include multi-CPU/processor computers and distributed processing systems having multiple networked nodes.

There are, however, significant obstacles for EDA vendors that wish to implement a parallel processing solution for IC layouts. Consider an example parallel processing approach in which an EDA tool geometrically divides an IC layout into multiple areas/portions and independently processes each portion using a different CPU. Such an approach is shown in FIG. 1 in which an example IC layout 107 has been divided into multiple geometric layout areas/portions 107*a*, 107*b*, 107*c*, and 107*d*. For PV processing, each layout portion 107*a*, 107*b*, 107*c*, and 107*d* may be processed for DRC correctness using a separate processor or CPU. Polygon 101 is located on a first layer and extends across all four layout portions 107*a-d*. Polygon 103*a-d* all reside on a second layer. Polygon 103*a* is located in layout portion 107*a*. Polygon 103*b* is located in layout portion 107*b*. Polygon 103*c* is located in layout portion 107*c*. Polygon 103*d* is located in layout portion 107*d*.

Consider further if the PV tool needs to perform geometric operations across multiple layout portions. An example of a geometric operation that is commonly performed by PV tool is the "polyEnclose" operation that selects polygons on a first layer (layerA) that enclose polygons on a second layer (layerB). This operation may be performed with count-based select to identify polygons on the first layer that enclose a specific number of polygons on the second layer.

The problem that arises is that the separate processors handling the different layout portions individually will not have enough information within its own respective layout portion to adequately perform the required processing. With respect to the example of FIG. 1, assume that the polyEnclose operation is performed to identify all objects on a first layer that encompass four objects on the second layer. Here, it can clearly be seen that polygon 101 on the first layer encompasses four polygons 103*a-d* on the second layer. Therefore, the correct result is that polygon 101 is selected.

However, polygon 101 also extends across multiple layout portions 107*a-d*. Assuming each layout portion 107*a-d* has been assigned to a different processor for processing, the data corresponding to any single layout portion may not provide enough information that would allow its corresponding processing entity to know the entire boundary of the polygon 101 or the number of polygons on the second layer that fall within that boundary. As can be seen from this simple example, the output of the select operation depends not only on the input data in the current layout portion, but also on the input data in other layout portions as well. Therefore, none of the processing entities would separately have enough data to make the proper identification of polygon 101 if each layout portion 107*a-d* is processed independently.

The present invention provides a method, system, and computer program product for facilitating multi-processing of IC designs and layout. In some embodiments, the invention provides an approach for handling geometric select operations in which data for different layout portions may be shared between different processing entities. The approach comprises the following actions: select phase one operation for performing initial select actions within layout portions; distributed regioning action for local regioning; distributed regioning action for global regioning and binary select; count aggregation for count-based select operations; and select phase two operations for combining results of selecting internal shapes and interface shapes.

Further details of aspects, objects, and advantages of the invention are described below in the detailed description, drawings, and claims. Both the foregoing general description and the following detailed description are exemplary and explanatory, and are not intended to be limiting as to the scope of the invention.

BRIEF DESCRIPTION OF THE FIGURES

The accompanying drawings are included to provide a further understanding of the invention and, together with the Detailed Description, serve to explain the principles of the invention.

FIG. 11 shows example pseudocode for performing distributed global regioning.

DETAILED DESCRIPTION

Figure 1:
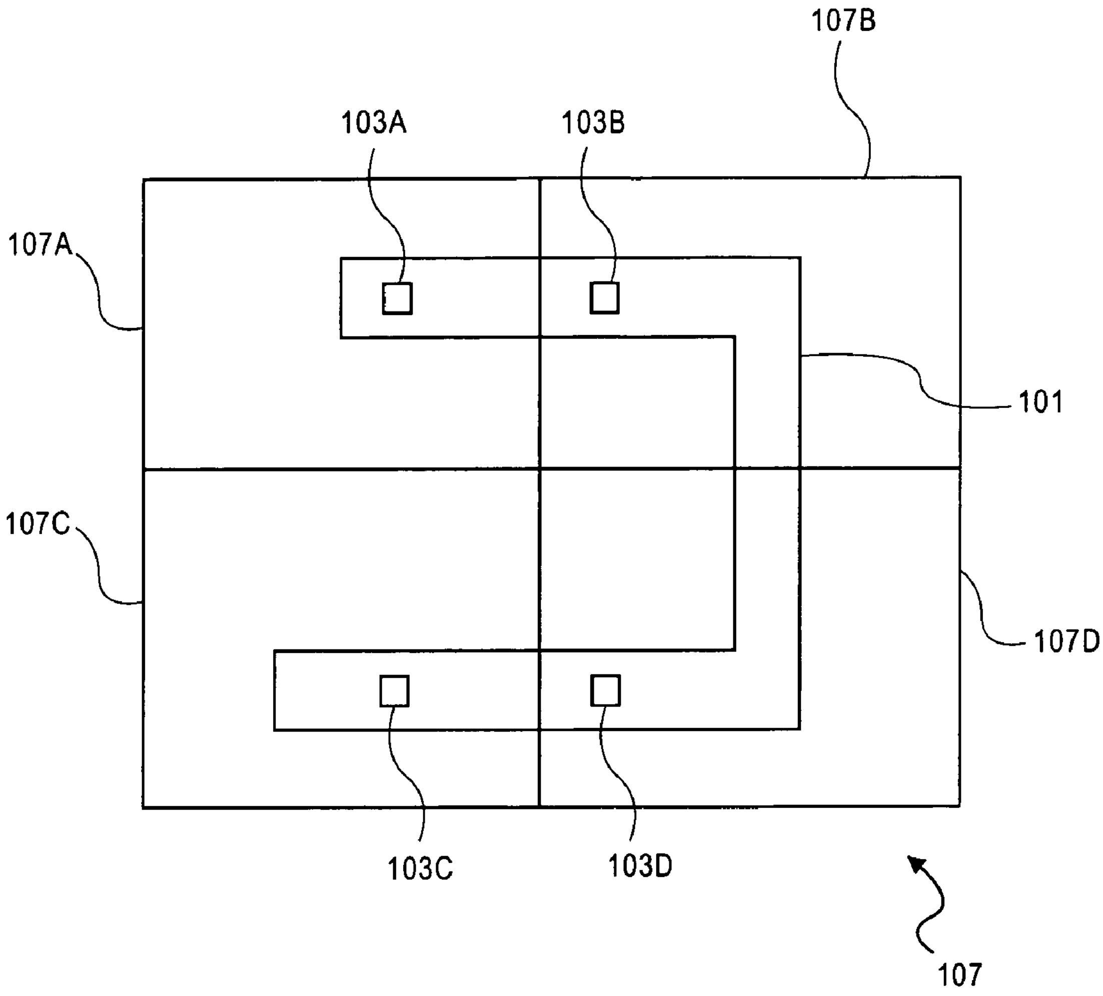
FIG. 1 shows an example layout that has been divided into four layout portions.

Disclosed is an improved method and system for implementing parallelism for execution of electronic design automation (EDA) tools, such as layout processing tools. An example of an EDA layout processing tool is a physical verification (PV) tool. To illustrate embodiments of the invention, the below description is made with respect to parallelism for PV tools. It is noted, however, that the present invention is not limited to PV tools, and may also be applied to other types of EDA layout processing tools.

According to some embodiments of the present invention, parallelism is implemented whereby the design layout is cut into multiple layout portions, and some or all of the layout portions are processed independently on different processing entities. Non-limiting examples of a processing entity includes a processor, a network node, or a CPU in a multi-CPU system.

Embodiments of the present invention provide a new approach for handling parallel processing for global operations, such as geometrical select operations. In some embodiments, select operations take two layers as input, and choose shapes on the first layer that have a specified geometrical relationship with the second layer. A binary select operation is one that chooses polygons which satisfy the specified relationship, regardless of the number of occurrences of the relationship. A count-based select operation selects polygons for which the number of occurrences of the specified relationship is prescribed. Given a select operation, the method first determines if the operation is a binary operation or a count-based operation. It then finds the polygons on each input layer whose select result will be affected by the data in other layout portions. For those polygons, synchronized computation steps are used to generate the correct select result.

The synchronized computation for global select according to some embodiments includes a distributed regioning action. In this action, each polygon is given an ID such that its ID is equal to that of another polygon if and only if they are a part of the same global region, as described below. Given a binary select operation, the process uses the distributed regioning calculation along with a technique called flag aggregation to compute the result. For a count-based select operation, a 2-pass method is used. In the first pass, the process performs the distributed regioning on both input layers. In the second pass, the process performs count aggregation to generate the global count result.

The result of the select operation is saved corresponding to each layout portion after the completion of the synchronized computation. The proposed method and framework will ensure the correct result for geometrical select operations in a multi-processing or distributed processing environment.

In one approach, the IC layout is divided into a plurality of layout "windows". A layout window is an area of the design layout assigned to an individual processing entity. A window by itself is a hierarchical layout with multiple layers. Shapes that touch the window boundary are cut into pieces along the window boundary. The pieces inside the boundary remain within the window layout. A design hierarchy has cell masters and cell instances, which are translations and/or rotations of the cell master. When a cell instance intersects a window boundary, a new master inside the window is generated that completes the hierarchy of the window's layout. Given a homogenous network of computers (i.e. each CPU has the same speed), window-based parallelism is implemented by mapping multiple windows to separate CPUs, where each window may be processed concurrently.

An exemplary approach for implementing windows is described in co-pending U.S. patent application Ser. No. 11/225,853, filed on Sep. 12, 2005, which is hereby incorporated by reference in its entirety. For illustrative purposes, the present embodiments of the invention will be described with respect to windows-based parallelism. It is noted, however, that the inventive concepts disclosed herein are not limited to windows-based parallelism, and indeed, may be applied to other types of parallelism and multi-processing approaches.

Figure 2A:
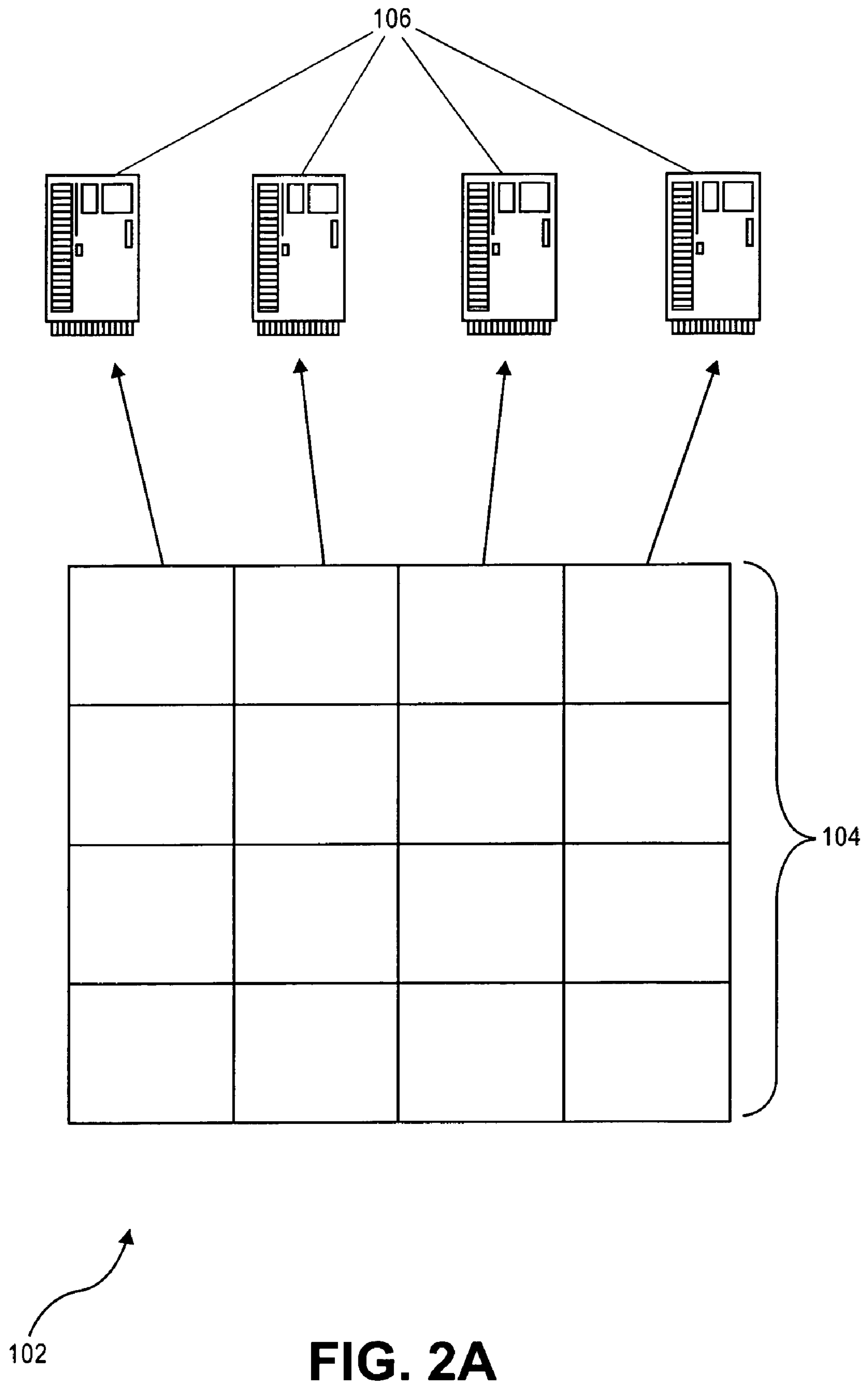
FIGS. 2A and 2B illustrate an IC layout divided into multiple layout windows and being processed by parallel processing entities.

A high-level description of windows-based parallelism will now be described. FIG. 2A provides a high-level illustration of windows-based parallelism, in which parallelism is provided by dividing an IC layout 102 into a plurality of two-dimensional (2D) "windows" 104. Some or all of the different windows 104 may be processed by the EDA tool in parallel by different processing entities 106. Examples of such processing entities include processes, threads, tasks, CPUs, nodes, and/or networked computing stations.

A layout window 104 may be implemented as a rectangular area of a design layout. The window 104 may itself be a hierarchical layout with multiple layers. Shapes that touch the window boundary are cut into pieces along the window boundary. The pieces inside the boundary remain within the window layout. In alternative embodiments, the window may comprise one or more non-rectangular shapes. The window itself may be non-rectangular.

A design hierarchy has cell masters and cell instances (linear transformations and translations of the master). When a window overlaps instances of a cell master, a new master inside the window is generated that completes the hierarchy of the window's layout. In some embodiments, two approaches are used to deal with cells and instances that intersect the window boundary. In the first approach, all shapes of the intersecting cell/instance are "promoted" to the top-level of the hierarchy, i.e., the instance disappears and shapes inside the window are "flattened". In the second approach, a new cell (a "variant", i.e., a modified copy of the original instance) is created and stored in the design hierarchy instead of the original cell/instance. In yet another approach, the layout is partially flattened, in which only a portion of the hierarchy is promoted to a higher level of the hierarchy or only a portion of the hierarchy is flattened.

This approach can be used to implement "output" partitioning, in which the intended output of some sort of processing (e.g., for an IC design layout to be verified) is partitioned into multiple portions or sections that can be individually operated upon by different processing entities. This is in contrast to "input" partitioning, in which partitioning is performed based solely upon the input data.

Figure 2B:
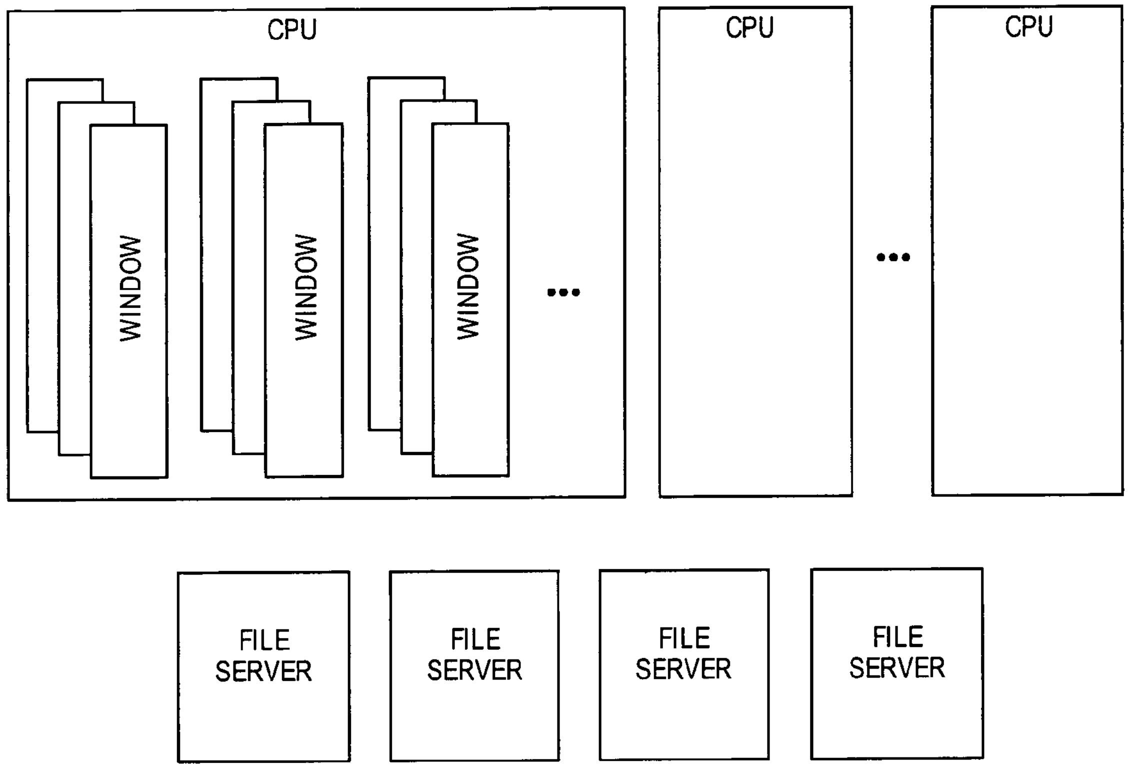

As shown in FIG. 2B, window-based parallelism can be implemented by mapping multiple windows to the same CPU. Furthermore, the number of file servers storing the design database and the number of CPUs need not be the same. While the invention supports heterogeneous networks of computers, in one embodiment, the type of compute server best suited to run large PV applications is a symmetrical system. An example is a system of 20 AMD Opteron based compute servers with one local disk and 2 CPUs each.

Figure 3:
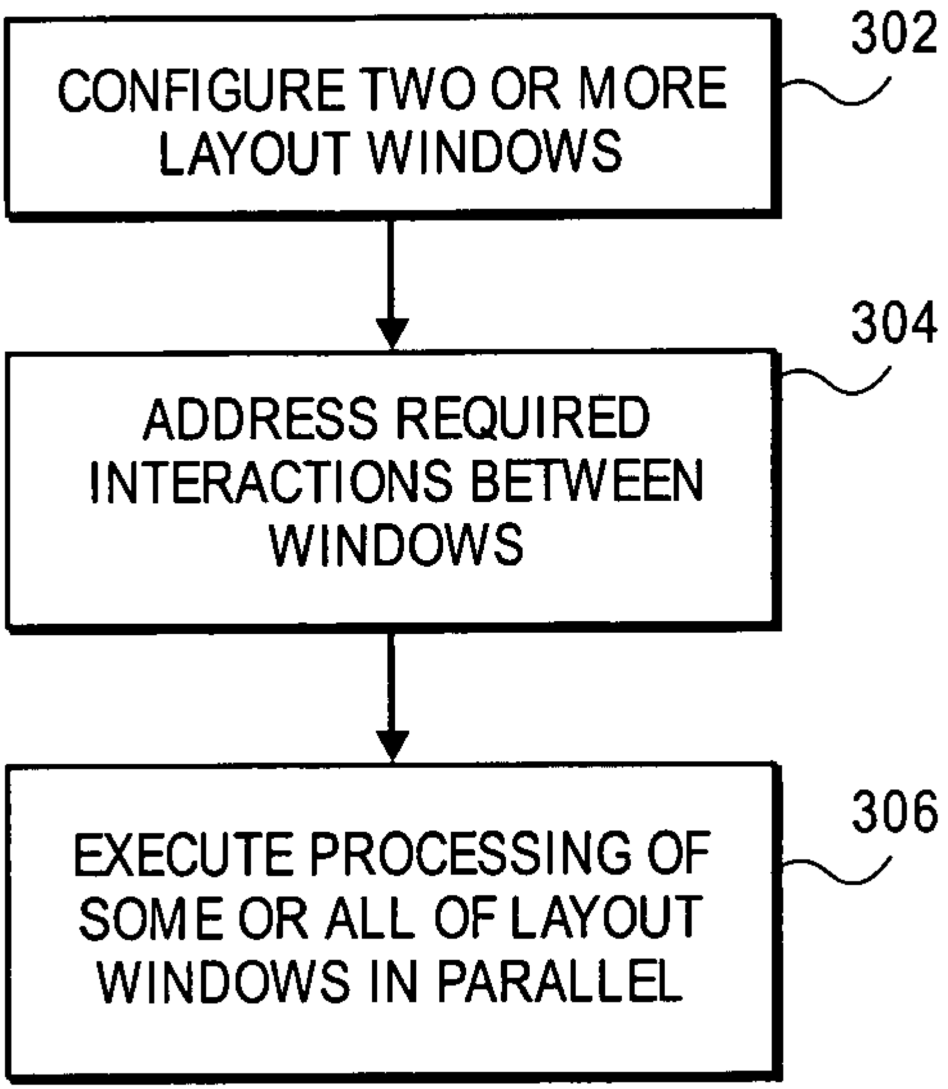
FIG. 3 shows a flow diagram of a process for implementing parallel processing for an IC design layout processing tool.

FIG. 3 shows a flowchart of a process for implementing parallelism according to an embodiment of the invention. At 302, the layout is divided into two or more layout windows.

The size, composition, and location of the windows can be selected to meet desired performance expectations. If the layout windows are configured to meet performance expectations, then this may be accomplished by having the user determine a desired timeframe for completing execution of the EDA workload and configuring the layout windows to meet the desired timeframe.

For example, consider a PV tool operation to verify an IC design layout. The IC layout may include many millions of transistors. On a conventional non-parallel PV tool, this verification workload may take at least an overnight run to complete, and may even take over a day to finish processing. The user may determine that the desired timeframe for completing the verification task is actually several hours, instead of overnight. This desired performance expectation may be taken into account when calculating the windowing and parallelism parameters for the workload, e.g., by dividing the layout into enough windows of the correct configuration such that parallel processing of the windows will result in the intended performance timeframe. In an alternate embodiment, the expected processing timeframe is not provided by the user; instead, the EDA system calculates optimal windowing and parallelism parameters based upon system scheduling requirements, system parameters, heuristics, and/or other non-user supplied factors.

Historical data and past processing of similar/same IC designs may be taken into account and analyzed to configure the layout windows. In many cases, the IC design presently being processed includes only incremental changes over a prior version of the IC design. Therefore, run-time data from processing the earlier version of the IC design can be used to create configurations for the layout windows that will accurately match the desired performance expectations.

In some embodiments, the windows configured for a given layout may have different sizes. In alternate embodiments, some or all of the windows may be configured to have the same size.

At 304, interactions between different windows are addressed. Certain operations are local in nature to a portion of a layout, while other operations will necessarily involve data from other portions of a layout. This action will identify and address the situation if processing the layout windows will necessarily involve data from other layout windows.

Figure 4A:
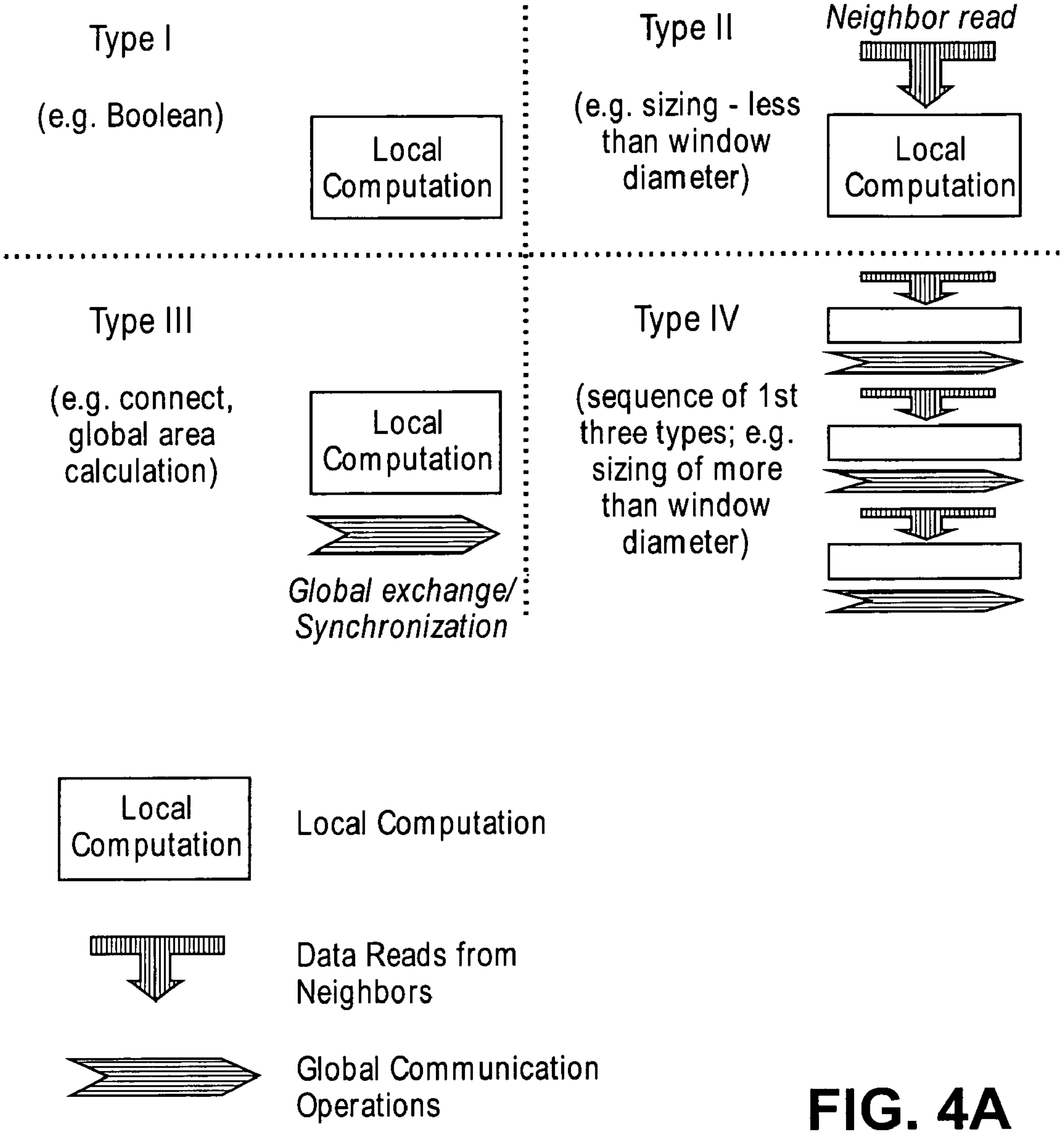
FIGS. 4A-D show categorization of operation types for a layout processing tool.

To perform this action, various classifications can be made for operations or rules that are intended to be performed upon a layout. FIG. 4A shows an example set of classifications for operations, such as rules to analyzed for a DRC operation.

Figure 4B:
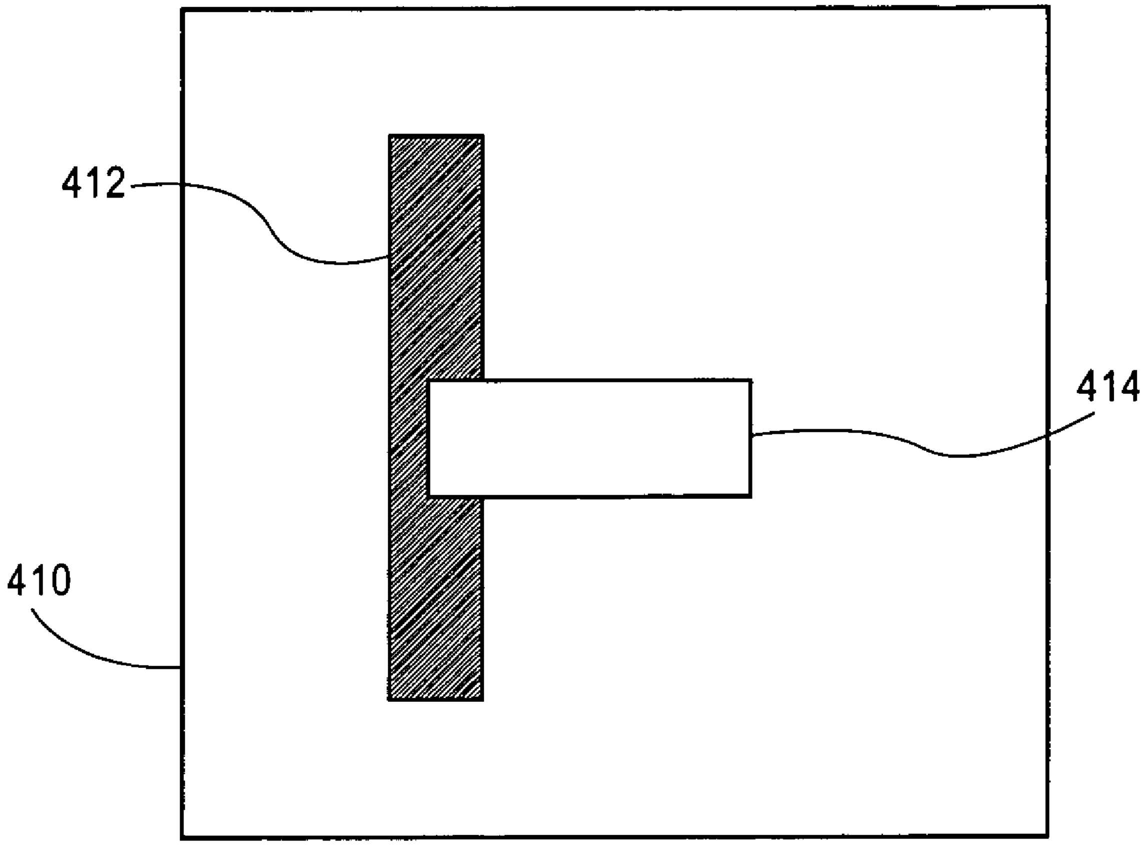

A first type of operation (Type I) is a local computation that can be performed without requiring any interaction with other windows. An example of this type of operation is a Boolean operation performed upon shapes in the layout window. To illustrate, consider layout window 410 in FIG. 4B, which includes polygons 412 and 414. If it is desired to perform either a Boolean AND or OR operations between these two shapes 412 and 414, then these operations can be executed locally in window 410 without involving data from any other layout windows.

A second type of operation (Type II) involves situations where data from neighboring windows must be accessed to perform the operation. This typically involves a limited interaction distance between one window and another.

Figure 4C:
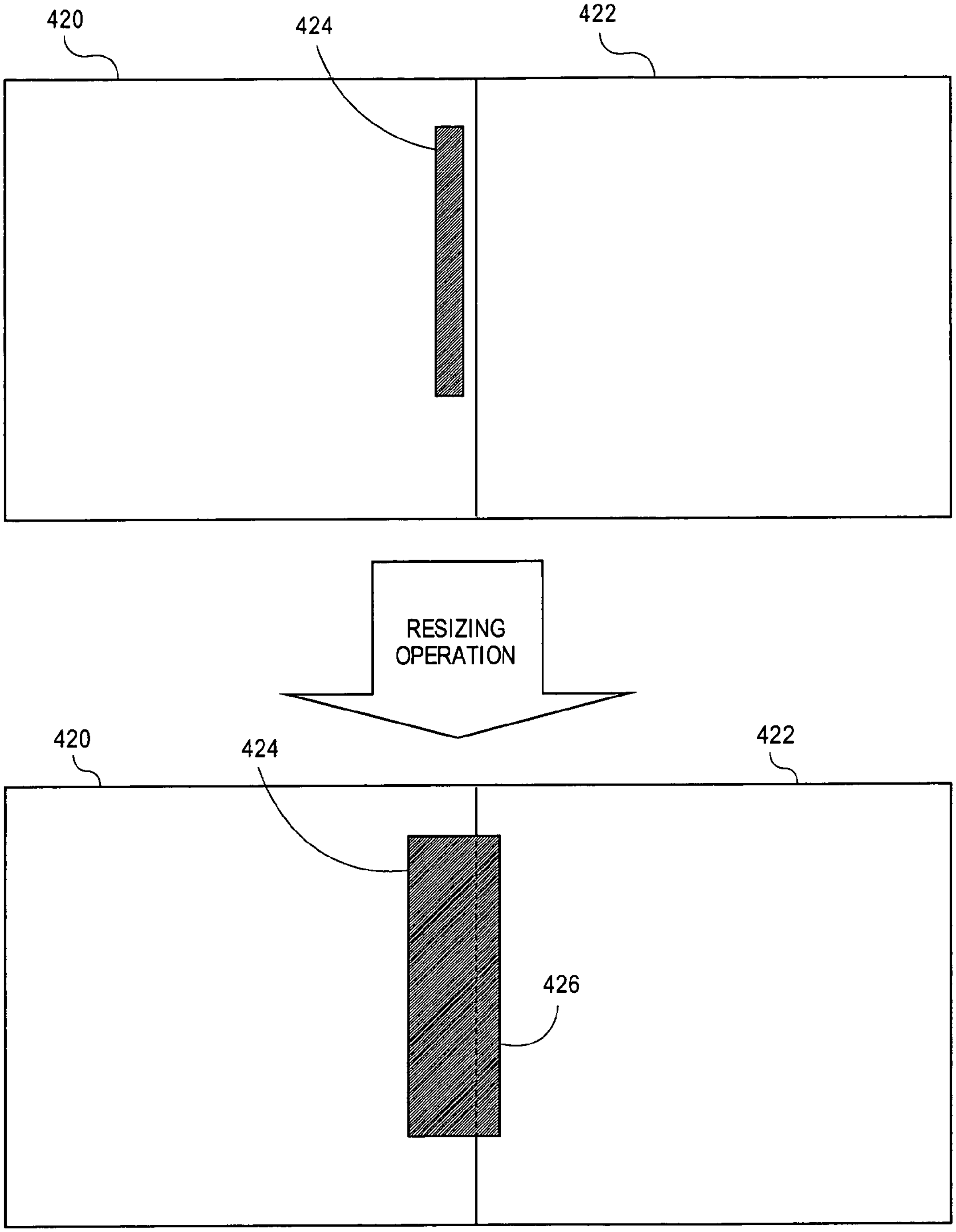

To illustrate, consider the layout windows 420 and 422 in FIG. 4C. A shape 424 is located in window 420. Assume that an operation is to be performed to resize shape 424 such that after the resizing operation, shape 424 includes a portion 426 that is located in neighboring window 422. The processing entity that operates upon window 422 will need to address this and know that portion of 426 will appear in the window, even if portion 426 is a result of operating upon the shape 424 that originally appears only in another window 420.

Figure 4D:
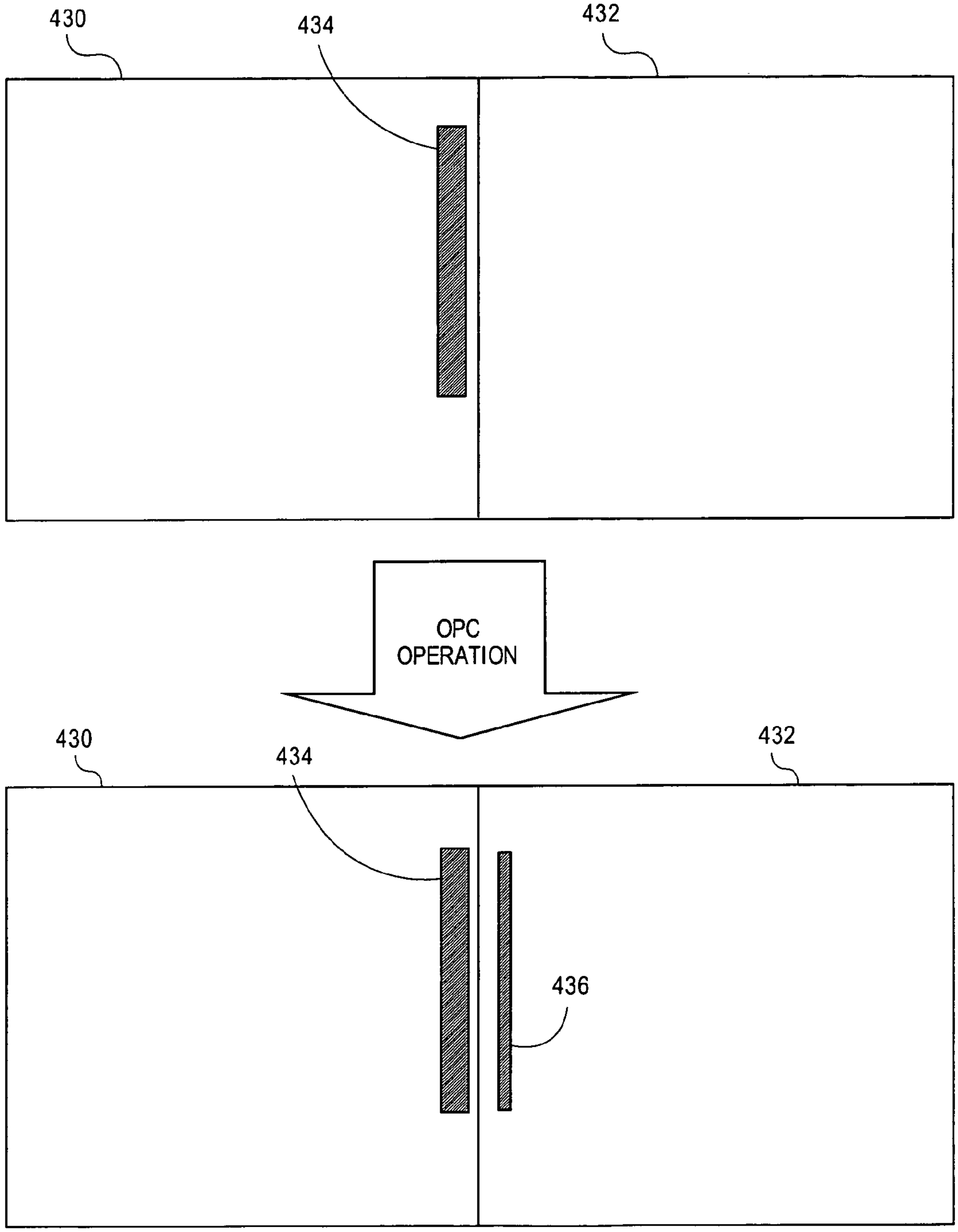

As another example, consider an optical proximity correction (OPC) operation that is to be performed upon a shape in a window. Adding a scattering bar to a layout is a common OPC operation performed by EDA tools. The illustrative example of FIG. 4D shows two windows 430 and 432 in which a shape 434 is located in window 430. Assume that it is desired to add a scattering bar 436 along the right-hand edge of shape 434. If the shape 434 is located sufficiently close to the border with neighboring window 432, then it is possible that scattering bar 436 will be located within window 432. The processing entity that operates upon window 432 will need to address this and know that scattering bar 436 will appear in the window, even if scattering bar 436 is a result of operating upon the shape 434 that originally appears only in another window 430.

A third type of operation (Type III) involves operations that relate to a global data exchange on output. For example, when calculating the total area of shapes on a given layer, one can calculate the total area of shapes on this layer in all windows, in parallel. Then, in a second step, the final global area is calculated by adding local areas in one global communication operation. Note that the global communication operations required for windowed PV are very similar to global data exchanges necessary when performing linear algebra algorithms on distributed memory machines.

The fourth type of operation (Type IV) is one that can be represented by a sequence of operations of Type I to III.

Figure 5:
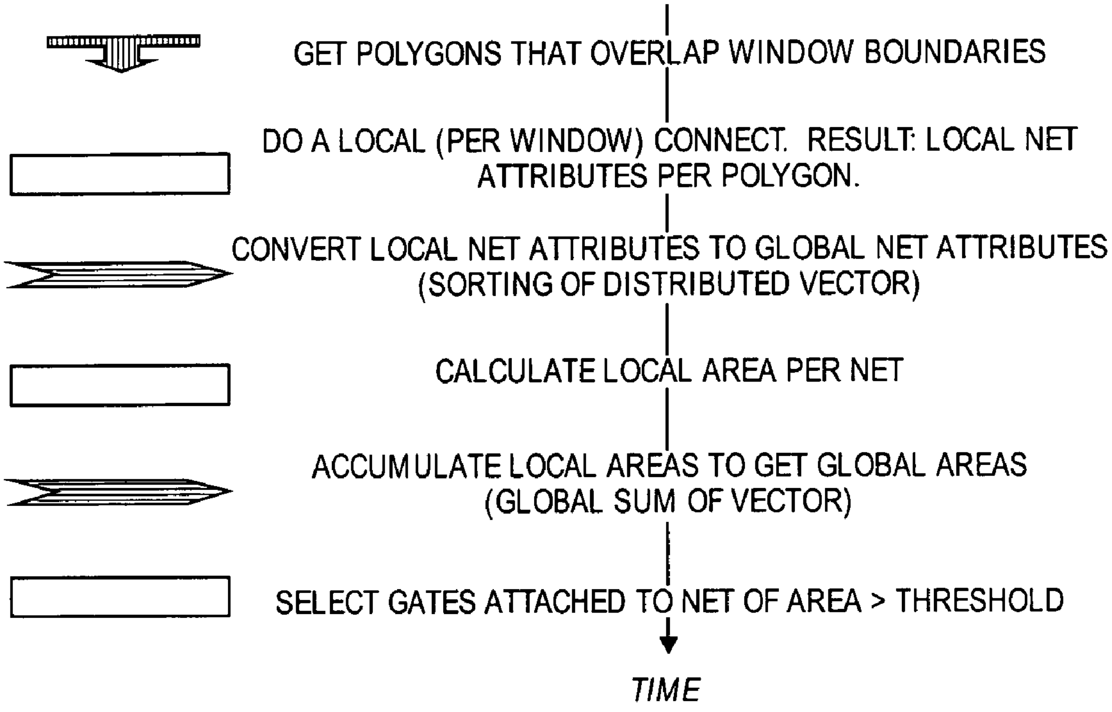
FIG. 5 shows the decomposition of a complex antenna check rule.

FIG. 5 shows an example of a DRC antenna check rule decomposed into the sequence of basic operations as described above. The complex rule has been decomposed into rules of Types I to III.

One way to address interactions between windows is to configure a "halo" around each window that interacts with a neighboring window. This means that operations performed for a given window will not just consider shapes within the boundaries of the window, but also any additional layout objects that exist within the expanded halo distance even if the layout objects appear outside of the window.

Figure 6:
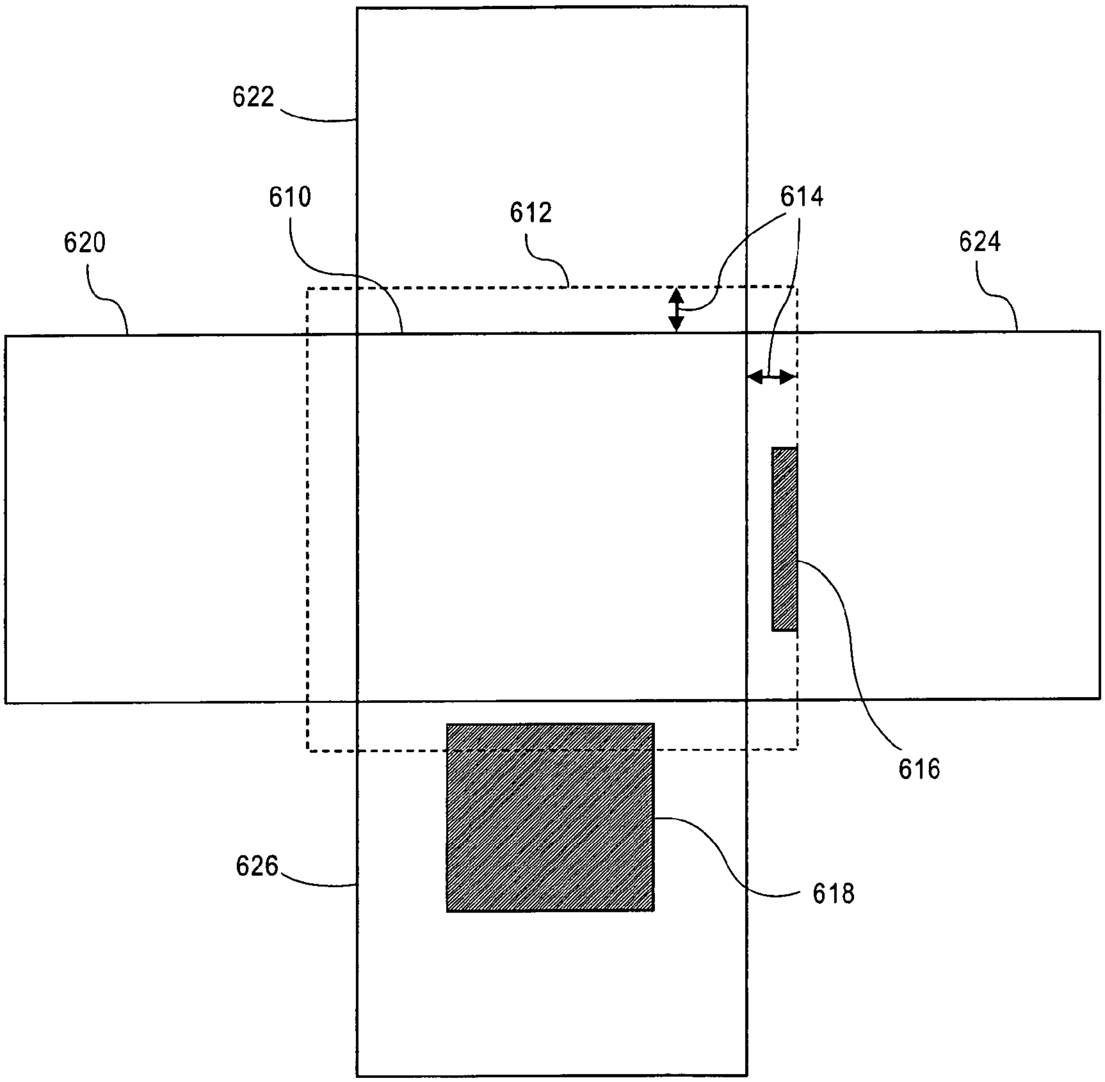
FIG. 6 illustrates a window configured with a halo.

FIG. 6 shows an illustrative example of a halo 612 that has been established around a window 610. Here, window 610 is surrounded by neighboring windows 620, 622, 624, and 626. A halo 612 has been configured with a halo spacing distance 614. Operations to be performed for window 610 will consider all objects falling within the expanded boundaries of the halo 612. Therefore, the portions of objects 616 and 618 that exist within the boundaries of halo 612 will be operated upon, even if those objects 616 and 618 do not appear within window 610.

In some embodiments, the halo distance is established to address interaction distances for the specific operations or DRC rules that are to be performed for a given window. For example, consider an OPC operation involving placement of scattering bars. Assume that the maximum distance that needs to be considered to place a scattering bar is 20 nanometers from an edge of an object. If so, then the minimum interaction distance from one window to another to address scattering bars is at least 21 nanometers. The largest interaction distance for all operations to be performed for the window is identified, and that largest interaction distance becomes the minimum value of the halo spacing for the window. If the largest interaction distance for all operations for a given window is based upon placing scattering bars, then the halo spacing distance will be set at 21 nanometers for that window.

In some embodiments, each window may potentially be associated with a different halo spacing distance, based upon the type of operations to be performed for a given window. In alternate embodiments, a common halo spacing distance is shared by some or all of the windows.

Returning back to FIG. 3, once the windows have been suitably configured and interactions between windows have been addressed, some or all of the windows are processed in parallel to perform the EDA operations upon the layout (306). As noted above, each processing entity may receive one or more of the layout windows for processing. In one embodiment, a "lazy scheduling" approach is taken to assigning operations to processing entities. In this approach, the most computationally difficult jobs are assigned to the most powerful processing entities. As described in more detail below, sampling can be performed to help identify the most computationally difficult operations.

The layout windows can be executed in parallel using, for example, either the distributed-memory parallel approach or the shared-memory parallel approach. The distributed-memory parallel approach involves software that can make efficient use of multiple processing devices, such as CPUs, where each CPU may access its own memory. With respect to implementation, message passing primitives (such as UNIX sockets, MPI, PVM, etc.) are typically employed when coordinating execution of program components running on different CPUs. The shared-memory parallel approach involves software that makes use of multiple processing devices, e.g., CPUs, that can address common physical memory. With respect to implementation, shared memory can be allocated, read and written from all program components being executed on different CPUs. Coordination is accomplished via atomic memory accesses, also called semaphores.

In some embodiments, the parallel processing is performed using distributed-memory parallelization. However, if the product's memory consumption is efficient; a distributed-memory parallel program can be ported to a shared-memory machine by emulating a distributed computer network on a shared-memory computer. Due to increased spatial locality, in some cases, a distributed parallel program ported back to a shared memory parallel machine runs faster than a similar program developed from the beginning using the shared-memory parallel programming paradigm.

Figure 7:
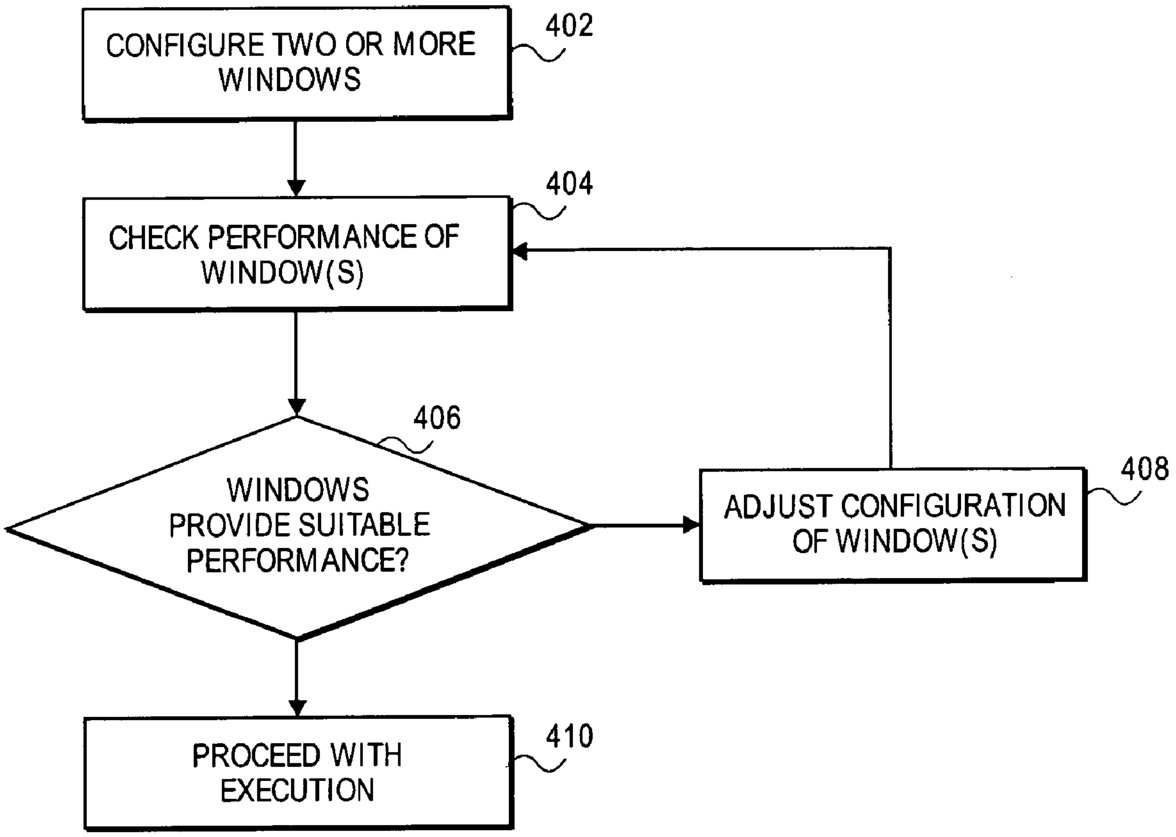
FIG. 7 shows a flow diagram of a process for implementing windows for a layout-processing tool.

FIG. 7 shows a flowchart of an approach for implementing windows according to an embodiment of the invention. At 402, the IC design is divided into a plurality of windows. The size of the windows are selected to meet or optimize the expected performance expectation of the parallelized processing. The amount of time required to perform EDA processing for a particular window may be dependent upon the size of the window. All else being equal, it is likely that the larger windows will require greater amounts of time for processing as compared to smaller windows. It is noted that the greater the size of the window, there likely will also be increased amounts of overhead for the parallel processing, e.g., in terms of communications and integration of data results. One rule of thumb that may be applied to certain systems is that the computation overhead is proportional to the area of the window while communications overhead is proportional to the perimeter of the window.

In addition, the type and/or quantity of certain structures within the window may affect the performance of processing for that window. The identification of certain types or quantities of structures within a window that will affect performance is very dependent upon the specific EDA tool operation that is being performed. For example, some types of processing, such as certain kinds of DRC rules checking, are dependent upon the density of structures within a given layout area. Therefore, all else being equal, windows having greater instance densities will be slower to process for these types of DRC verification than for other windows having smaller instance densities. Other examples include certain DRC rules that relate specifically to pattern density. Therefore, for these pattern density-related rules, windows having greater pattern densities will be slower to process for these types of DRC verification than for other windows having smaller pattern densities. The next action is to check or predict the expected performance of the processing system based upon the set of layout windows that have been identified (404). As described below, "sampling" can be used to provide performed estimation. If the expected performance meets the desired performance level (406), then the processing system continues with parallel execution of the identified layout windows (410).

If the expected performance does not meet desired performance levels, then one or more of the layout windows are reconfigured (408) and the process returns back to 404. Examples of parameters for the layout windows that may be reconfigured include location, size, shape, and/or number of windows.

According to some embodiments of the present invention, parallelism is implemented in which the design layout is cut into multiple windows, and multiple windows are processed independently on different processing entities. With this type of parallelism, operations that make up a PV rule deck can be broadly classified into 3 types based on the way in which they are processed:

1. Local operations can be processed without any knowledge of the environment outside the boundary of a window. For example, the common area between shapes on two layers (often termed as the Boolean AND operation between two layers) can be computed independently in each window, without any communication with other windows.

2. Halo-dependent operations require each processor assigned to a window to be cognizant of data up to a finite distance into the neighboring windows. Operations such as separation checks and sizing fall into this category. Such operations require data exchange between neighboring windows as a pre-processing step. However, once the data exchange has occurred, no further communication is needed between the windows.
3. Global operations require data throughout the design layout, not just in the neighboring windows to compute the correct result. Operations such as connectivity extraction and the geometrical select operations fall into this category. Typically, global operations need communication between windows during the course of execution of the operation.

As noted above, one of the most difficult challenges facing a multi-processing PV tool is to produce the accurate result for global operations, such as geometrical select operations commonly used for processing a DRC rule deck. A geometrical select operation may take 2 polygon layers, layerA and layerB as input, select layerA polygons that satisfy certain geometrical relationships with layerB polygon and put them on the output layer layerOut.

Six common geometrical select operations for PV tools are referred to herein as the "polyInside", "polyOutside", "polyCut", "polyTouch", "polyInteract", and "polyEnclose" operations.

The polyInside operation creates a derived polygon layer consisting of polygons on the first layer that are completely inside polygons on the second layer. The following is an example format for a polyInside command:

layerOut=polyInside(layer*A*,layer*B*)

This operation selects all polygons on layer A that are inside a polygon on layer B, and places the selected polygons onto the output layer layerOut.

The polyOutside operation creates a derived polygon layer consisting of polygons on the first layer that are completely outside polygons on the second layer. The following is an example format for a polyOutside command:

layerOut=polyOutside (layer*A*,layer*B*)

This operation selects all polygons on layer A that are outside a polygon on layer B, and places the selected polygons onto the output layer layerOut.

The polyCut operation selects polygons on a first layer that share a partial area with polygons on a second layer. The following is an example format for a polyCut command:

layerOut=polyCut(layer*A*,layer*B*[count constraint])

This operation selects layerA polygons that share a partial area with layerB polygons and places the selected polygons onto the output layer layerOut. Count constraints may be specified for the selection operation.

The polyTouch operation selects polygons on a first layer that are completely outside of polygons on a second layer but share a coincident edge. The following is an example format for a polyTouch command:

layerOut=polyTouch (layer*A*,layer*B*[count constraint])

This operation selects layerA polygons that are completely outside of layerB polygons but that share a coincident edge and places the selected polygons onto the output layer layerOut. Count constraints may be specified for the selection operation.

The polyInteract operation selects polygons on a first layer that have an area overlapping, touching, or inside of polygons on a second layer. The following is an example format for a polyInteract command:

layerOut=polyInteract (layer*A*, layer*B*[count constraint])

This operation selects polygons on layerA that have an area overlapping, touching, or inside of layerB and places the selected polygons onto the output layer layerOut. Count constraints may be specified for the selection operation.

The polyEnclose operation selects polygons on a first layer that contain polygon(s) on a second layer. The following is an example format for a polyEnclose command:

layerOut=polyEnclose (layer*A*,layer*B*[count constraint])

This operation selects layerA polygons that contain layerB polygons and outputs the results to layerOut. Count constraints may be specified for the selection operation.

As described above, FIG. 1 illustrates a simple example of how the select result may be affected by windowing. Assume that the polyEnclose operation is executed to identify all polygons on a first layer that contain four polygons on a second layer and that the example layout is divided into windows 107*a-d*. In each window, a portion of the shape 101 on the first layer appears and encloses one shape 103*a-d* on the second layer. However, since only a portion of shape 101 exists in each window, shape 101 may not be selected for some windows if the operation is performed in each window independently. This is despite the fact that the correct result is that shape 101 in each window should be selected. As can be seen from this simple example, the output of the select operation depends not only on the input data in the current window, but also on the input data in other windows as well.

Figure 8:
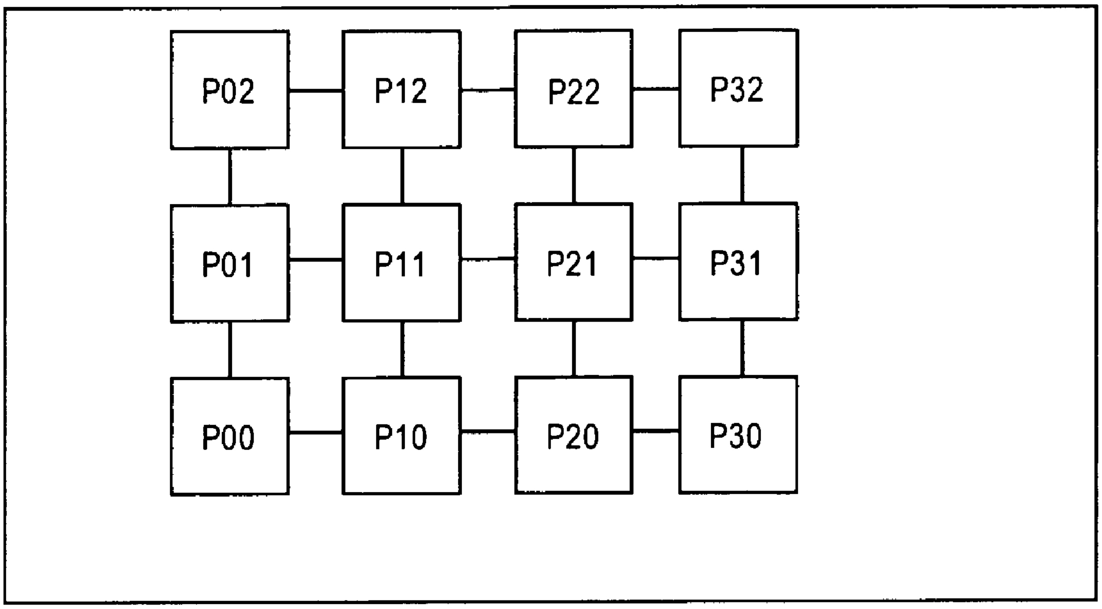
FIG. 8 illustrates an example computation model.

As shown in FIG. 8, the plurality of processing entities in one embodiment is modeled as a network of processors arranged in a two dimensional grid. It consists of M×N processors arranged into an M×N grid such that processor P(i, j) is connected to its 4 neighbors: P(i+1,j), P(i−1, j), P(i, j+1), P(i, j−1). Each window is mapped to one of the processors.

Figure 9:
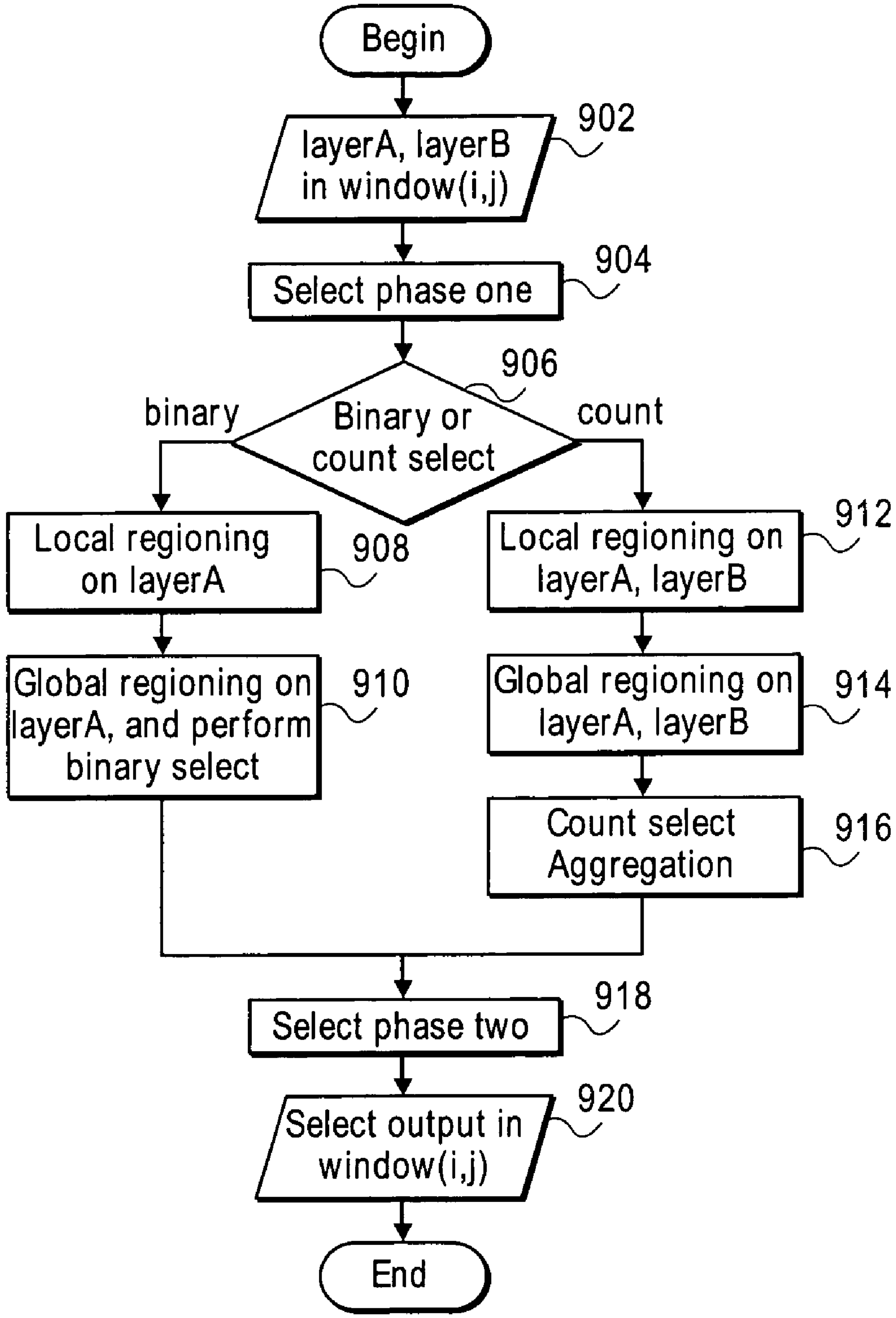
FIG. 9 shows a process flow of a method for handling geometric select operations according to an embodiment of the invention.

FIG. 9 shows the top level diagram for the global select method. The method comprises the following actions: (a) Select phase one operation; (b) Distributed regioning step 1: Local regioning; (c) Distributed regioning step 2: Global regioning and binary select; (d) Count aggregation, for count-based select operations only; and (e) Select phase two operation.

The method takes two or more layers as input (902), and chooses shapes on the first layer that have a specified geometrical relationship with the second layer. Given a select operation with two input layers, layerA and layerB, the polygons on each input layer are divided into 2 categories:

polygons whose global results are not affected by other windows, called internal shapes, Polygons whose global results are affected by other windows, called interface shapes.

For each internal shape on layerA, the correct select result can be computed in the current window. However, for each interface shape on layerA, a global synchronization phase is used to achieve the correct global select result.

The process enters the select phase one action flow to begin processing for the select operation (904). The select phase one action processes both internal as well as interface shapes. Internal shapes can be processed individually by each window. Interface shapes proceed forward by making a determination whether the operation is a binary selector a count-based select operation (906). In the present embodiment, a different processing flow may be taken for each type. A binary select operation is one that chooses polygons which satisfy the specified relationship, regardless of the number of occurrences of the relationship. A count-based select operation chooses polygons for which the number of occurrences of the specified relationship is prescribed. The logical flows of computation for these two types of global select operations are different. Therefore, given a geometrical select operation which takes two layers as input, we first determine whether it is a binary operation or a count-based operation. In one embodiment, the polyEnclose operation is always count-based, regardless of the existence of a count constraint. Given a select operation, the method first determines if the operation is a binary operation or count-based operation. It then finds the polygons on each input layer whose select result will be affected by the data in other layout portions. For those polygons, synchronized computation steps are needed to generate the correct select result.

At the center of the synchronized computation for global select are distributed regioning steps. As noted above, for each interface shape on layerA, a global synchronization phase is used to achieve the correct global select result. To facilitate the global synchronization in the distributed regioning step, the following information is recorded for each interface shape on layerA:

layerA interface shape identifier (ID);

layerA interface shape (X, Y) location;

Local select result. For binary select, the local select result is a flag which indicates the shape is selected or not in the current window. For count-based selects, the local select results include the relations of the given layerA interface shape with layerB shapes. For the latter case, the (X, Y) location information of interface shapes on layerB is recorded as well.

For binary operations, the distributed regioning actions comprise a local regioning action which operates to perform binary select operations upon individual windows in a local manner (908) followed by a global regioning action which aggregates results from across multiple windows (910).

For count-based select operations, the process performs local regioning on layers A and B in the windows (912), followed by global regioning on the layers (914), and then a count aggregation action is performed (916).

The process then proceeds to the select phase two (918), which selects outputs from the windows based upon a combination of the internal and interface results (920). In this phase, the process combines the select result of interface shapes with the select result of internal shapes, and produces the final output. No inter-window communication or synchronization is involved in this action.

Each of these actions will be described in more detail below.

Distributed Regioning: Data Model

The present section describes an embodiment of a data model used in the distributed regioning procedure. In the distributed regioning actions, each polygon is given an identifier such that its identifier is equal to that of another polygon if and only if they are a part of the same global region, as described below. Given a binary select operation, the process uses the distributed regioning calculation along with a technique called flag aggregation to compute the result. For a count-based select operation, a 2-pass method is used. In the first pass, the process performs the distributed regioning on both input layers. In the second pass, the process performs count aggregation to generate the global count result. The result of the select operation is saved corresponding to each layout portion after the completion of the synchronized computation.

As used herein, a region refers to a set of polygon shapes that overlap or abut along one or more edges. Graph G=(V, E) is used as the data model for the distributed regioning, where V is the node list, and E is the edge list. Each interface shape is represented as a node v in the graph which contains the following attributes:

regionId: of the form (i, j, shapeId) where (i, j) is the window Id.

globalId: the global region Id, after the regioning step is done.

flag: used in binary select.

There is an edge between node $v_x$ and $v_y$ if shape $v_x$ and $v_y$ are connected as a result of overlap or abutment, and therefore belongs to the same region.

The distributed regioning method contains two steps:

1. An initial local regioning graph is formed by computing the initial node list and edge list based on the select phase one result in the current window and its direct neighbor windows. This step is referred to as "local regioning".
2. A global regioning graph is computed by performing the synchronized global communication to aggregate the graph in each window. This step is referred to as "global regioning".

Local Regioning

Figure 10:
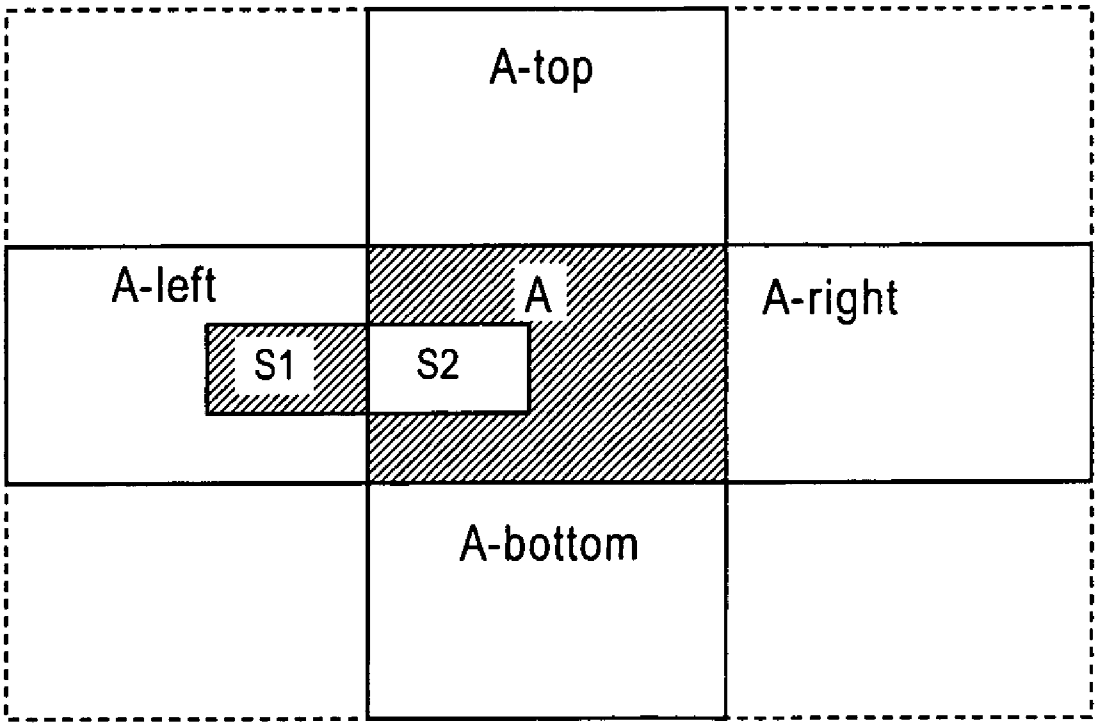
FIG. 10 illustrates a window having relationships with neighboring windows.

The purpose of the local region procedure is to compute the initial node list and edge list just based on its direct neighbor windows. For the present embodiment, the definition of the direct neighbor windows only applies for the left, right, top, and bottom neighbors. Diagonal neighbors along the possible four corner windows are not considered direct neighbors in the present embodiment, although may be considered neighbors in alternate embodiments. To illustrate, consider the example layout shown in FIG. 10. The direct neighbors of the window A is A-top, A-left, A-bottom, and A-right.

The procedure for local regioning of each window according to one embodiment includes the following four steps:

1) Grouping the interface shapes into four groups based on their location: left side, bottom side, right side, and top side.

2) Identifying the corresponding neighbor's interface shapes. For example with respect to FIG. 10:

the neighbor A-left will pass its right-side interface shapes to window A, the neighbor A-right-will pass its left-side interface shapes to window A, the neighbor A-bottom will pass its top-side interface shapes to window A, and the neighbor A-top will pass its bottom-side interface shapes to window A.

3) Build the local region pair if the local interface shape and the neighbor interface shape were from the same original shape. For example, in FIG. 10, it can be seen that local shape S1 in window A-left and local shape S2 in window A are both from the same global shape. This identification can be made by noting that each local shape meet at the boundary of its respective window at exactly the same locations with exactly the same configuration along that boundary. Based upon this identification, a shape pair {S1, S2} is formed.

4) Repeat the step 3 and eventually form the local region pair map which records the relationship between the neighbor interface and the local interface shape.

Global Regioning

The purpose of this action is to find which interface shapes in each window belong to the same region globally. Giving the local regioning result (V(G), E(G)) as input, the global regioning procedure computes the global disjoint-set graph in a distributed computing environment modeled as a 2D grid of processors (M rows×N columns).

The global regioning procedure is accomplished using the following 3 steps:

1) compute the local disjoint-set graph in each window. Any suitable standard disjoint-set algorithm may be applied here, e.g., as described in t. Cormen et al, Introduction to Algorithms, The MIT Press, 1994.

2) Use synchronized communication to perform graph aggregation. FIG. 11 shows example pseudo-code of a process that can be run on each window with processor ID P(x,y.) to implement this action. Portion 1102 of the pseudocode of FIG. 11 describes horizontal aggregation, in which a given window receives node and flag data from other windows in the horizontal direction in an array of windows. Portion 1104 of the pseudocode describes vertical aggregation, in which a window receives node and flag data from other windows in the vertical direction in the array of windows.

3) Determine global regioning result based on the aggregation result;

Binary Select

The binary select can be implemented as a by-product of global regioning. For binary select operations, only the first input layer needs to be globally regioned. Each region contains a flag attribute. Initially, this flag is set based on the local select result generated in select phase one. Then this flag is aggregated during the global regioning step. Each binary select operation will have a separate flag aggregation formula. Polymorphism is used in the actual implementation so the global regioning engine does not need to know the exact formula for region flag aggregation. The global select result can be determined once the global regioning step is finished.

The following approaches can be employed to perform flag interpretation according to some embodiments of the invention:

Flag Aggregation for polyInteract Operation

Flag interpretation:

0: layerA shape is NOT selected locally

1: layerA shape is selected locally.

Flag aggregation formula:

| | Win2 | |
|---|---|---|
| Win1 | 0 | 1 |
| 0 | 0 | 1 |
| 1 | 1 | 1 |

Final select result:

0: layerA shape is NOT selected globally

1: layerA shape is selected globally

Flag Aggregation for polyInside Operation

Flag interpretation:

0: layerA shape is NOT selected locally

1: layerA shape is selected locally

Flag aggregation

| | Win2 | |
|---|---|---|
| Win1 | 0 | 1 |
| 0 | 0 | 0 |
| 1 | 0 | 1 |

Final select result:

0: layerA shape is NOT selected globally

1: layerA shape is selected globally

Flag Aggregation for polyOutside Operation

Flag interpretation:

0: layerA shape is NOT selected locally

1: layerA shape is selected locally

Flag aggregation

| | Win2 | |
|---|---|---|
| Win1 | 0 | 1 |
| 0 | 0 | 0 |
| 1 | 0 | 1 |

Final select result:

0: layerA shape is NOT selected globally

1: layerA shape is selected globally

Flag Aggregation for polyCut Operation

Flag interpretation:

0: layerA shape is NOT selected locally; in addition, it is not enclosed by layerB shape.

1: layerA shape is selected locally

E: layerA shape is NOT selected locally, but it is enclosed by layerB shape.

Flag aggregation

| | Win2 | | |
|---|---|---|---|
| Win1 | 0 | 1 | E |
| 0 | 0 | 0 | 1 |
| 1 | 0 | 1 | 1 |
| E | 1 | 1 | E |

Final select result:

0 or E: layerA shape is NOT selected globally;

1: layerA shape is selected globally

Flag Aggregation for polyTouch Operation

Flag interpretation:

0: layerA shape is NOT selected locally and it does not interact with any layerB shape.

1: layerA shape is selected locally

D: layerA shape is NOT selected locally, but it does interact with some layerB shape so that layerA is not selected.

Flag aggregation

| | Win2 | | |
|---|---|---|---|
| Win1 | 0 | 1 | D |
| 0 | 0 | 0 | D |
| 1 | 1 | 1 | D |
| D | D | D | D |

Final select result:

0 or D: layerA shape is NOT selected globally;

1: layerA shape is selected globally

Illustrative Example for Binary Processing

Figure 12A:
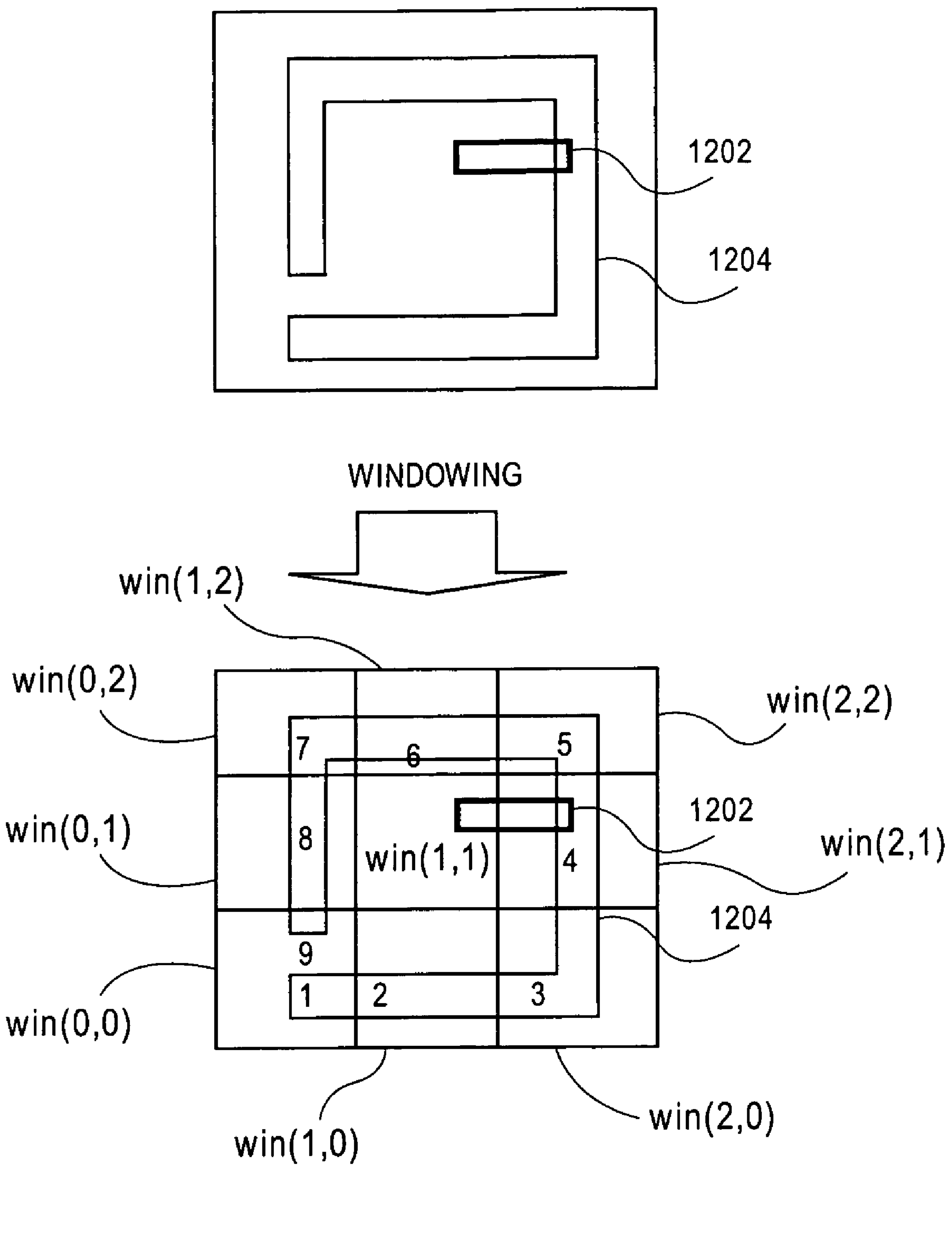
FIGS. 12A-D illustrate an example approach for handing polyInteract operations.

Reference is now made to FIGS. 12A-D which shows an illustrative example for the invention. FIG. 12A shows an example layout having a polygon 1204 located on layer A and a polygon 1202 located on layer B. Assume that it is desired to perform the following operation upon this layout:

layerOut=polyInteract(layer*A*,layer*B*)

This operation selects polygons on layerA that have an area overlapping, touching, or inside of layerB and places the selected polygons onto the output layer layerOut. Count constraints may be specified for the selection operation.

Further assume a 3×3 grid of network computers to perform this operation, with the layout is cut into nine windows: win(0,0), win(1,0), win(2,0), win(0,1), win(1,1), win(2,1), win(0,2), win(1,2), and win(2,2). Based upon the window boundaries, polygon 1204 is cut into 9 separate pieces 1-9, with of the windows each including at least one piece of polygon 1204. It can be seen that window win(0,0) includes two pieces 1 and 9 of polygon 1204 within its boundaries. Polygon 1202 is cut into two pieces based upon the window boundaries.

As previously discussed with reference to FIG. 9, the first action is to perform Select phase one processing (904). A determination is made whether binary or count-based select processing is being performed (906). Here, the geometric select operation is a binary operation and is not related to a particular count requirement or specification. Therefore, the process performs actions along the binary operation path of the process flow, in which processing is performed to first perform local regioning (908) and then perform global regioning and binary select operations (910).

Figure 12B:
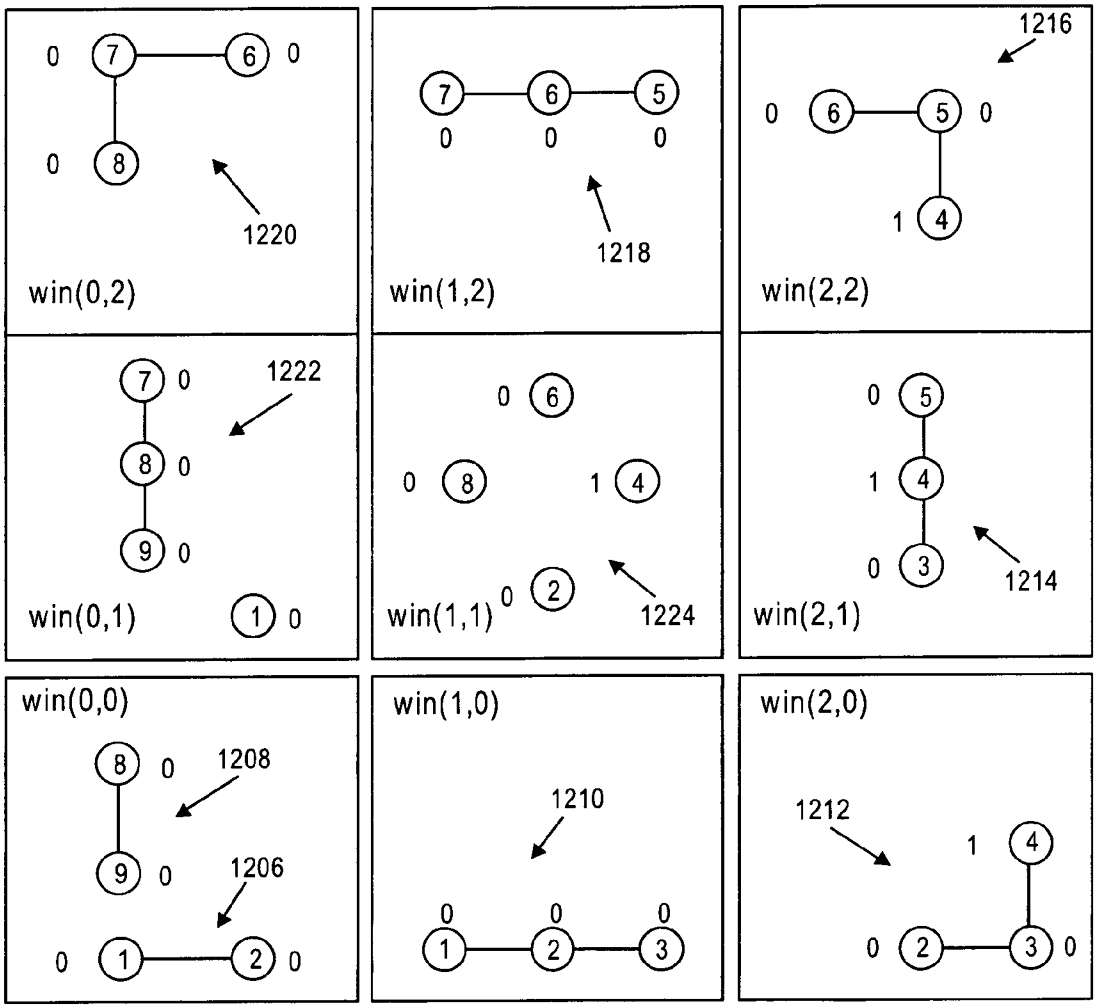

FIG. 12B shows the result of performing local regioning on the example layout of FIG. 12A. Each window corresponds to a data structure containing the polygons or portions of polygons on layer A that reside in that window. Furthermore, the data structures track the correspondence of those polygon portions (referred to herein as "nodes") that extend to neighboring windows. Finally, the flag value is set for the window based upon the geometric select operation performed within that window.

Here, it can be seen that window win(0,0) includes two nodes 1 and 9 of the polygon 1204. The figure graphically shows that these nodes 1 and 9 reside in the window win(0,0) and further that these nodes correspond to portions in other windows. In particular, symbol 1206 identifies the correspondence between node 1 in window win(0,0) and node 2 in neighboring window win(1,0). Similarly, symbol 1208 identifies the correspondence between node 9 in window win(0,0) and node 8 in neighboring window win(0,1). The flag for each of these nodes is set to "0", indicating that none of these portions correspond to the condition for the polyInteract operation, i.e., none of these nodes interact or overlap with a polygon from layer B based upon a local select operation.

This type of information is similarly established for each of the windows. In window win(1,0), symbol 1210 illustrates that node 2 is contained in that window, and further that node 2 corresponds to node 1 in left neighboring window win(0,0) and node 3 in right neighboring window win(2,0). The flag values for these nodes are set to "0", indicating that none of these nodes interact or overlap with a polygon from layer B. Symbols 1222, 1220, 1218 provide similar information for the contents windows win(0,1), win(0,2), and win(1,2), respectively.

In window win(2,1), symbol 1214 illustrates that node 4 is contained in the window, and further that node 4 corresponds to node 3 in lower neighboring window win(2,0) and node 5 in upper neighboring window win(2,2). It is noted that the flag value for node 4 is set to "1", indicating that this node interact or overlap with a polygon from layer B as satisfying the selection condition for the polyInteract operation for a local select operation. This can be seen in the layout illustration of FIG. 12A, in which portion 4 of polygon 1204 on layer A intersects with polygon 1202 of layer B in window win(2,1).

In window win(2,0), symbol 1212 illustrates that node 3 is contained in that window, and further that node 3 corresponds to node 2 in left neighboring window win(1,0) as well as node 4 in upper neighboring window win(2,1). The flag values for node 3 is set to "0", indicating that this node does not interact or overlap with a polygon from layer B based upon a local select operation. However, it can be seen that the flag value for node 4 is set to "1", indicating that node 4 from upper neighboring window win(2,1) does satisfy the selection condition for the polyInteract operation. Similarly, in window win(2,2), symbol 1216 illustrates that node 5 is contained in that window, and further that node 5 corresponds to node 6 in left neighboring window win(1,2) as well as node 4 in lower neighboring window win(2,1). The flag values for node 5 is set to "0", indicating that this node does not interact or overlap with a polygon from layer B for a local select. However, the flag value for node 4 is set to "1", indicating that node 4 from lower neighboring window win(2,1) does satisfy the selection condition for the polyInteract operation.

The center window win(1,1) includes symbol 1224 which shows that the window does not contain any nodes, but there are nodes 2, 4, 6, and 8 in the neighboring windows win(1,0), win(2,1), win(1,2), and win(0,1), respectively. The flags for nodes 2, 6, and 8 are set to "0", indicating that none of these nodes in neighboring windows satisfy the selection condition for the polyInteract operation. However, the flag value for node 4 is set to "1", indicating that node 4 from right neighboring window win(2,1) does satisfy the selection condition for the polyInteract operation.

Returning back to the flowchart of FIG. 9, the next action is to perform global regioning and binary select operations (910). As described in the pseudocode of FIG. 11, the process first performs horizontal aggregation to receive data from other windows in the horizontal direction, from neighbor window to neighbor window. Thereafter, vertical aggregation is performed to receive data from other windows in the vertical direction, from neighbor window to neighbor window.

Figure 12C:
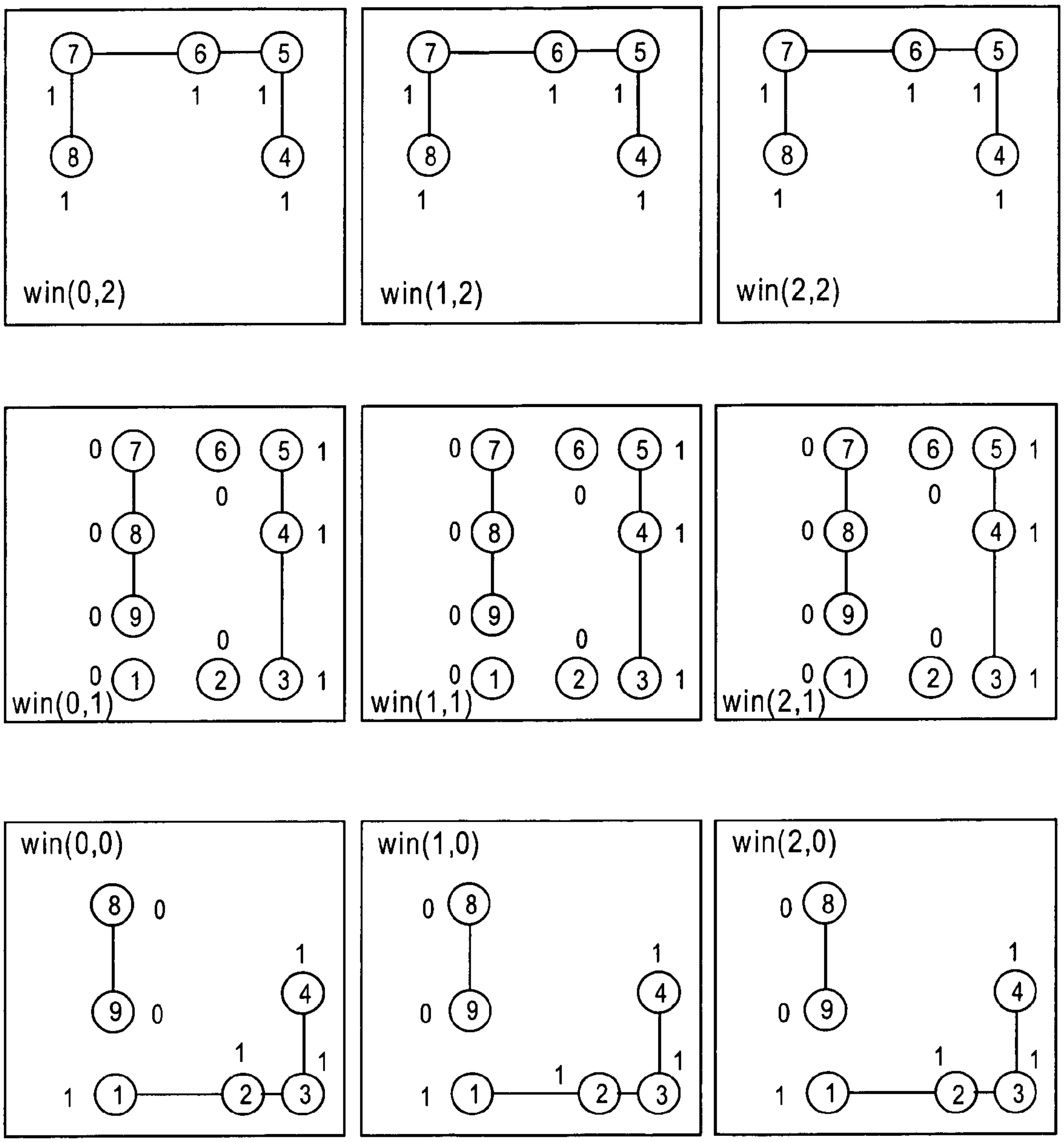

FIG. 12C shows the results of performing horizontal aggregation for the windows data shown from FIG. 12B. The node and flag data for each window in a common row have been passed and aggregated with each other. At the end of the process, it can be seen that each of the windows that are in a common row end up with the same or similar set of node and flag data.

Figure 12D:
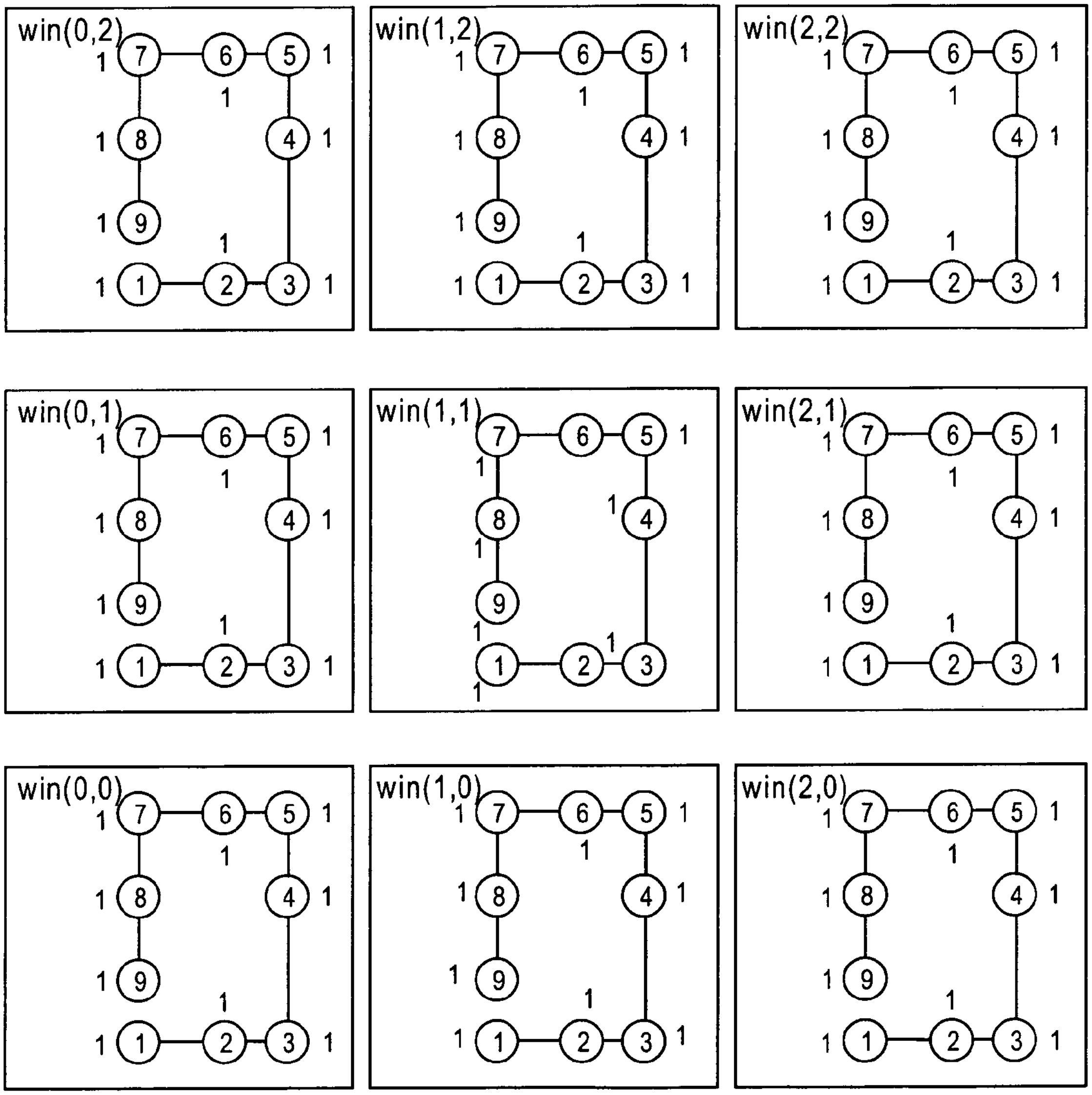

FIG. 12D shows the results of performing vertical aggregation for the windows data shown from FIG. 12C. The node and flag data for each window in a common column have been passed and aggregated with each other. It can be seen that each of the windows end up with the same or similar set of node and flag data.

An optimization that can be performed is to only perform such aggregations for windows that contain flag data indicating relevant information, e.g., having a flag value set to "1". For example, this optimization may be performed by not aggregating the data from window (1,1) to other windows since this window does not contain any nodes and/or any nodes having a flag value of "1". In addition, an optimization can be performed to only perform aggregation and updating for a window having data that is relevant for processing. For example, this optimization may be performed by not updating the node data for window (1,1) since this window does not contain any nodes.

Once global regioning has been performed, the select phase two operation may be performed (918) (as shown and described with respect to FIG. 9). This action combines the select results of interface shapes and select results of internal shapes to produce a final result.

Count-Based Select Aggregation

For count based selects, the relationships between interface regions on the selected layer (layerA) and the selecting layer (layerB) have to be considered in a pairwise manner in order to compute the counts of the desired interactions, so as to eliminate duplicate interactions occurring between the same regions in multiple windows. The pairwise relationships between regions are obtained during the first pass of the selects, as previously described. The removal of duplicate interactions is used by employing a set data structure such as the set and map data structures in the C++ standard template library. The count of interactions between interface regions, in addition to the count of interactions that a region has with interior shapes in each window gives the total interaction count for a region. Only regions that meet the user-specified count constraints for the operation are selected to be placed on the output layer.

Details of the pair wise aggregation between regions depend on the type of the operation. The polyInside and polyOutside select operations cannot have count specifications for selection, and hence are not considered. Details for each of the other select operation types follow.

Count-Based Aggregation for polyInteract

Figure 13A:
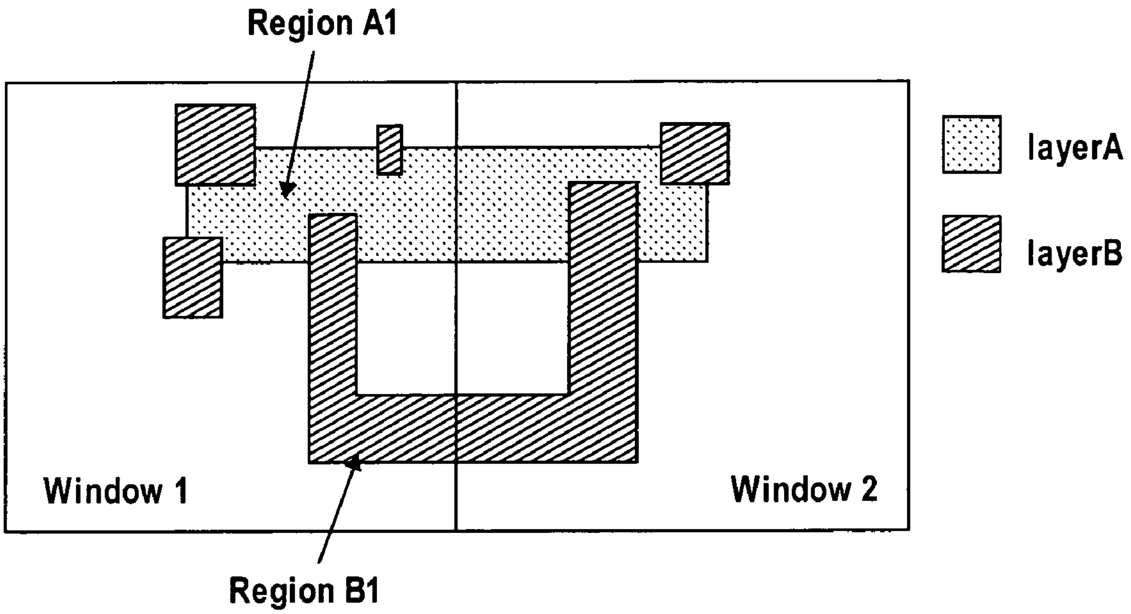
FIG. 13A illustrates an example approach for handling count-based aggregation for polyInteract.

FIG. 13A shows count-based aggregation for a polyInteract operation in two windows. As seen in this figure, in window 1, global region A1 interacts with 3 interior shapes and an interface region B1 on layerB. This can be depicted in symbolic form as:

A1: {B1 I}, 3

Likewise, the result in window 2 can be represented as:

A1: {B1 I}, 1

Where, {B1 I} indicates an interaction relationship with region B1 and the integer following the comma indicates the number of internal relationships. This notation will be used throughout the description for count based selection. The final result for region A1 after aggregation will be:

A1: {B1 I}, 4

Thus, region A1 has interactions with 5 regions on layerB.

Count-based Aggregation for polyTouch

The polyTouch operation is exclusive in nature, that is, in order for a layerA shape to get selected, it must only have an abutment relationship with all the layerB shapes it interacts with. If a layerA shapes abuts one layerB shape, but overlaps another layerB shape, it cannot be selected. The exclusive nature of the semantics of the polyTouch operation makes it possible for a layerA polygon (or region) to be disqualified globally based on a single interaction it has with a layerB polygon. Such disqualifications must be taken into account during count-based aggregation.

Figure 13B:
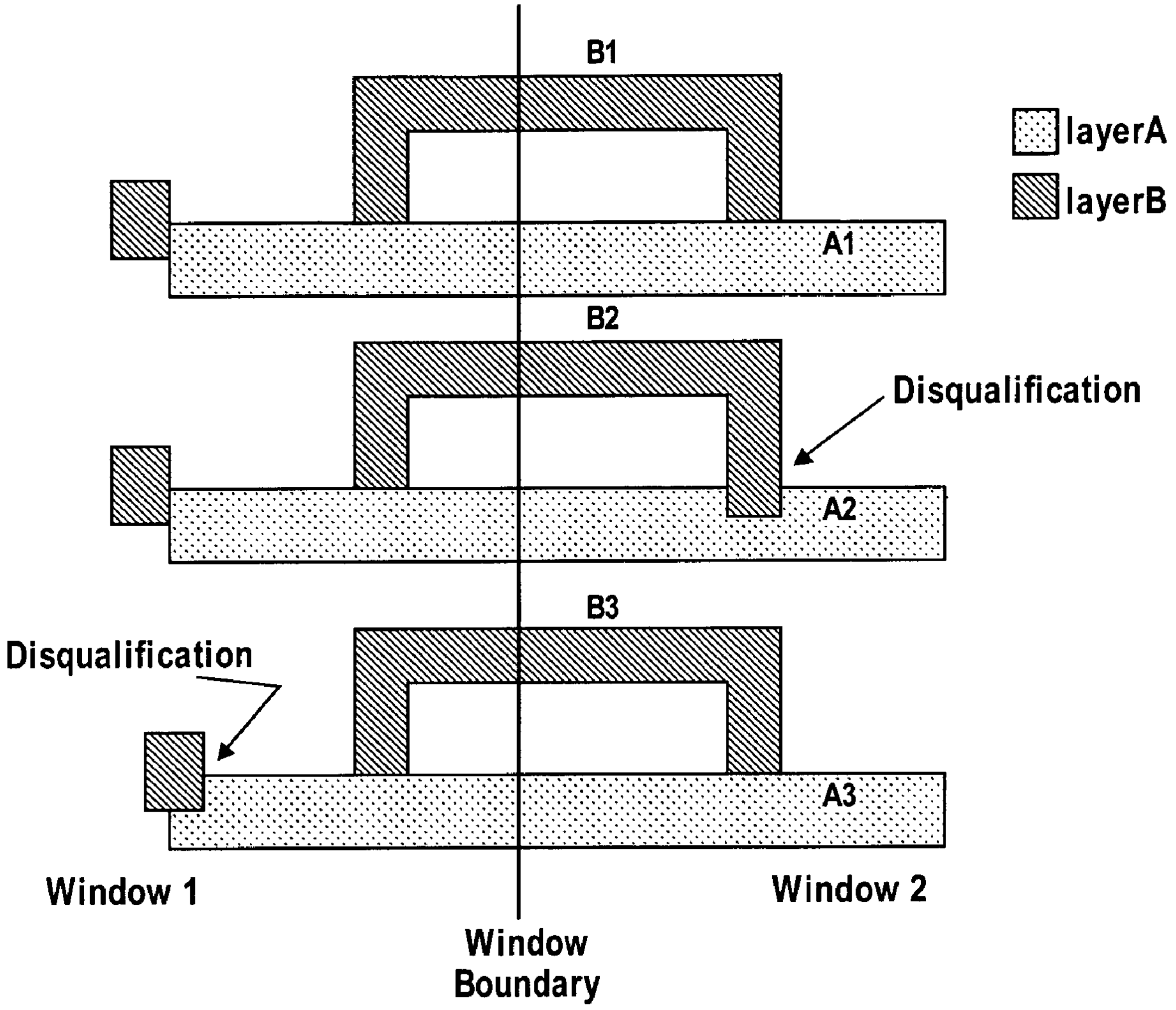
FIG. 13B illustrates an example approach for handling count-based aggregation for polyTouch.

FIG. 13B shows 3 layerA interface regions namely A1, A2 and A3 divided into window 1 and window 2. In window 1, region A1 abuts an interior shape and interface region B1 from layerB, region A2 abuts an interior shape and interface region B2, whereas the overlap between an interior shape and region A3 causes region A3 to be disqualified. This can be represented as:

A1: {B1, T}, 1
A2: {B2, T}, 1
A3: D

Where 'T' indicates an abutment relationship and 'D' indicates a disqualification.

In window 2, region A1 abuts region B1, whereas region A2 overlaps region B2 resulting in a disqualification, and region A3 abuts region B3. All layerA regions have none (zero) interactions with interior shapes in window 2. This can be represented as:

A1: {B1, T}, 0
A2: D
A3: {B3, T}

During count-based aggregation, duplicate interactions are filtered out (such as that between A1 and B1 in both windows), and interior interactions are added together. Disqualifications from either window supersede any other interactions that may have been encountered. Therefore, the final result after aggregation is represented as:

A1: {B1, T}, 1
A2: D
A3: D

Thus, region A1 abuts 2 layerB shapes, regions A2 and A3 do not abut any shapes.

Count-Based Aggregation for Polycut

Two kinds of interactions between shapes need to be considered when doing count-based aggregation for polyCut operations. A shape on layerA can overlap (but not be enclosed by) a shape on layerB or it can be enclosed by a shape on layerB. In the former case, the layerA shape is selected, in the latter case, it is not selected. In count-based aggregation, the local relationship between shapes may indicate that a layerA shape is enclosed by a layerB shape in one window, but it could be cut in another window. Therefore, it is essential that the nature of relationships between shapes is resolved before determining the count of the interactions.

Figure 13C:
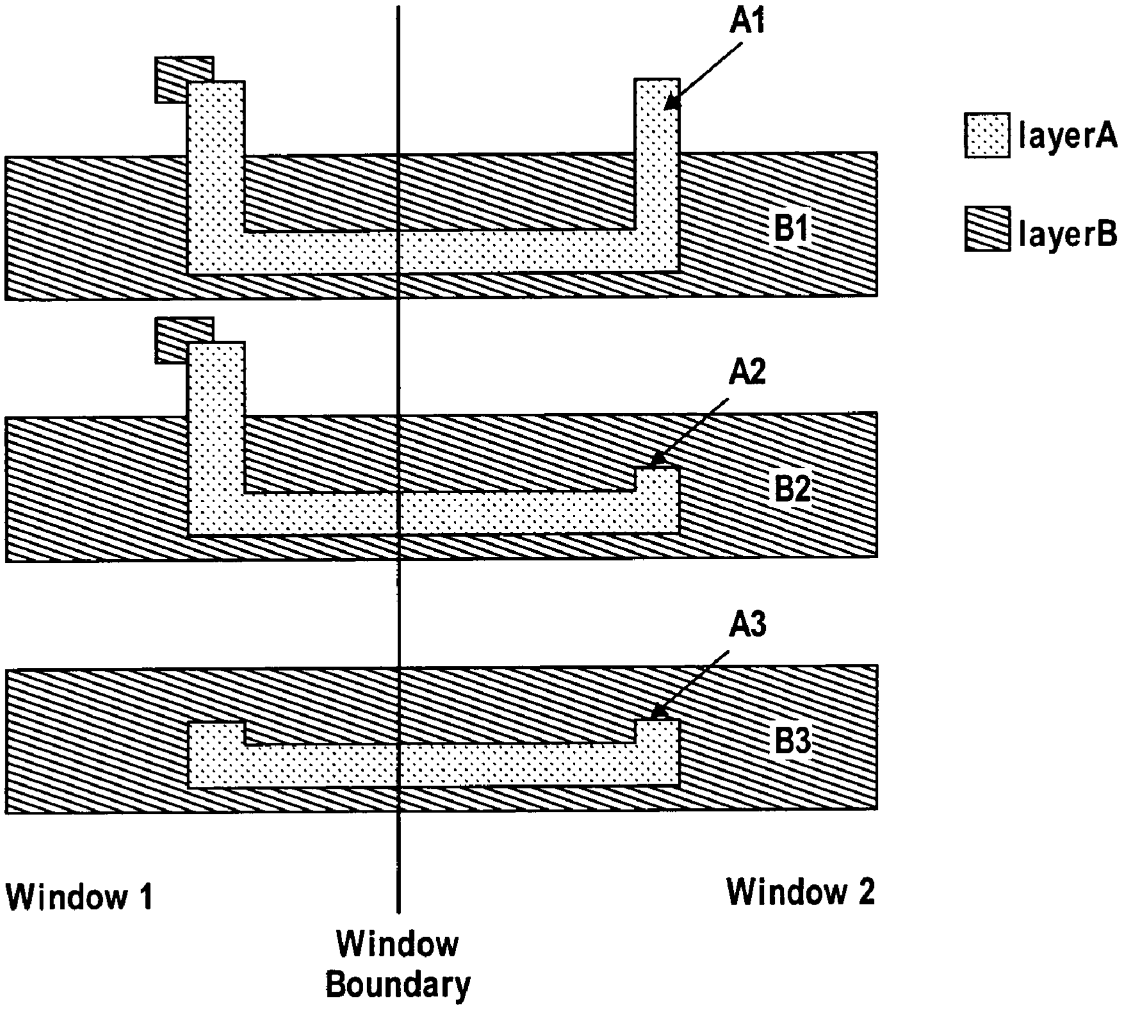
FIG. 13C illustrates an example approach for handling count-based aggregation for polyCut.

FIG. 13C considers 3 cases of interactions between interface shapes: region A1 cuts region B1 in both windows 1 and 2, region A2 cuts region B2 in window 1, but is enclosed by region B2 in window 2, region A3 is completely enclosed by region B3 in both windows. Regions A1 and A2 cut one interior shape in each window. The representation of results in window 1 is:

A1: {B1 C}, 1
A2: {B2 C}, 1
A3: {B3 E}, 0

The representation of results in window 2 is:

A1: {B1 C}, 0
A2: {B2 E}, 0
A3: {B3 E}, 0

Where 'C' indicates a cut relationship and 'E' indicates an enclosing relationship between shapes respectively.

During count based aggregation, region A1 is seen to be cut in both windows, and is marked as cut globally, after removing the duplicate relation between A1 and B1. Region A2 is cut in window 1, and that relation supersedes the enclose relation in window 2. Since region A3 is enclosed in both windows 1 and 2, it is not marked as cut globally. After taking into account the interactions with interacting shapes, the representation of the final result is:

A1: {B1 C} 1
A2: {B2 C} 1
A3: {B3 E}

Thus, regions A1 and A2 are cut by 2 shapes, and region A3 is not cut by any shapes.

Aggregation for polyEnclose

The aggregation procedure for polyEnclose operations both with and without count constraints is identical. This is because in order to determine that a layerA shape encloses a layerB shape, it is necessary for the enclosure relationship to be verified in each and every window in which the layerB shape is present. In the context of this discussion, the words region and shape are used interchangeably.

Figure 13D:
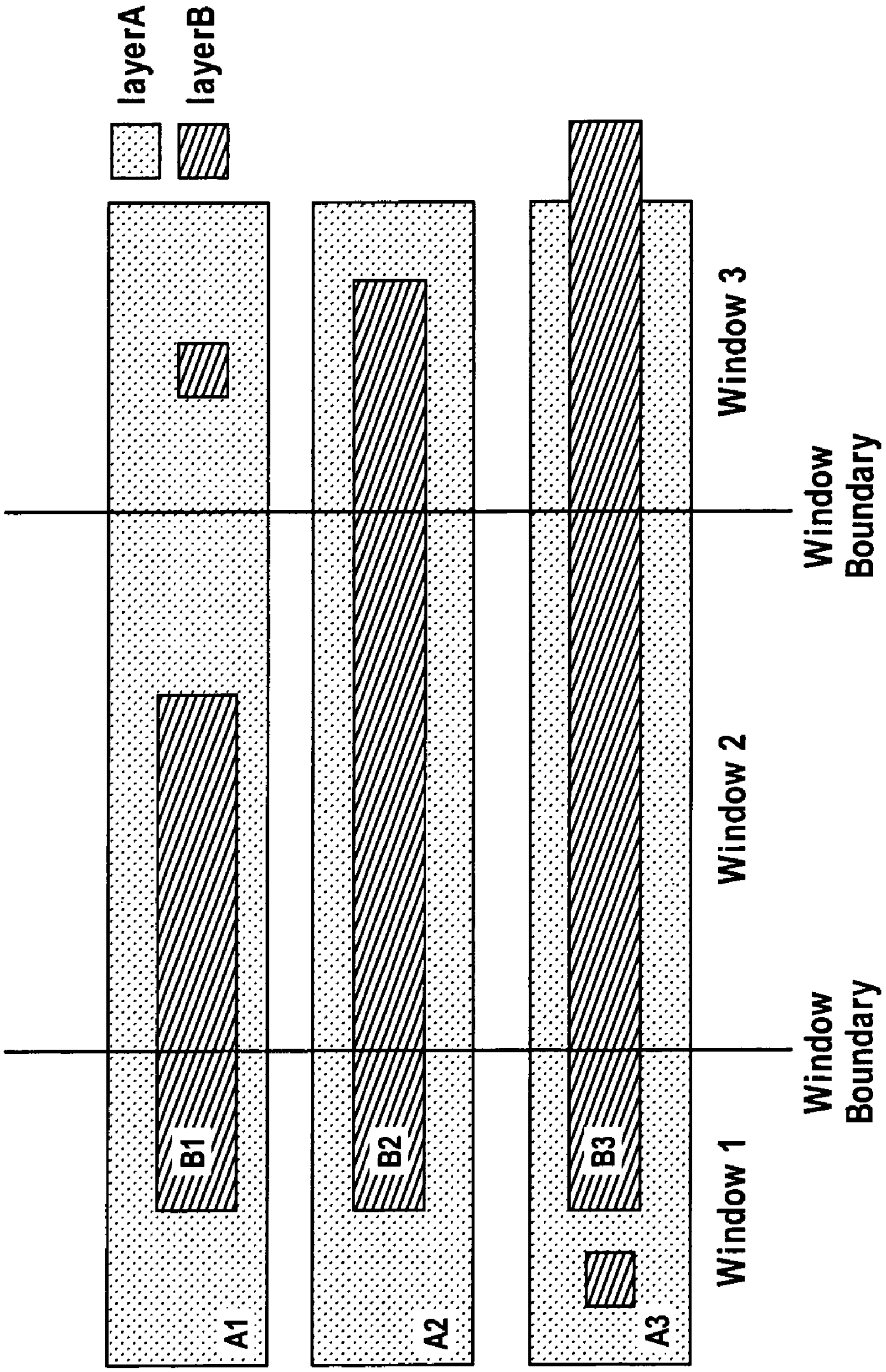
FIG. 13D illustrates an example approach for handling count-based aggregation for polyEnclose.

Consider FIG. 13D which shows 3 layerA regions, namely A1, A2 and A3, and 3 layerB regions, namely B1, B2 and B3 in 3 windows. Region A1 encloses an interior layerB shape in window 3, and region A3 encloses an interior layerB shape in window 1 respectively. The representation of results in each of the 3 windows is as seen below:

Window 1:
A1: {B1 E}, 0
A2: {B2 E}, 0
A3: {B3 E}, 1

Window 2:
A1: {B1 E}, 0
A2: {B2 E}, 0
A3: {B3 E}, 0

Window 3:
A1: { }, 1
A2: {B2 E}, 0
A3: {B3 C} 0

Where 'E' indicates an enclosing relationship, 'C' indicates a cutting relationship and '{ }' indicates the absence of a relationship with any interface region.

As is visually evident, region A3 does not enclose region B3. From an algorithmic perspective, region A3 does not enclose region B3 as it does not have an enclosing relationship with it in each window in which the enclosed region is present. This last point is emphasized by considering the relationship between regions A1 and B1, which is globally enclosing, even though there is no relationship between these two regions in window 3. After the removal of duplicate relationships, the final global result becomes:

A1: {B1 E}, 1
A2: {B2 E}, 0
A3: {B3 C}, 1

Thus, region A1 encloses 2 shapes, region A2 encloses 1 shape and region A3 encloses 1 shape.

Optimizations may be performed to improve the processing efficiencies in the system. As described with respect to FIG. 11, aggregation action are performed to perform global regioning of the windows. As noted above, an optimization that may be performed is to only perform aggregations for windows that contain flag data indicating relevant information, e.g., having a flag value set to "1". For example, this optimization may be performed by not aggregating the data from window (1,1) to other windows since this window does not contain any nodes and/or any nodes having a flag value of "1". In addition, an optimization can be performed to only perform aggregation and updating for a window having data that is relevant for processing. For example, this optimization may be performed by not updating the node data for window (1,1) since this window does not contain any nodes. Another optimization that may be performed is to group multiple select operation together and handle the local/global regioning and count aggregation of multiple select operation in one communications loop. This optimization reduces the overall synchronization time that is needed for the process.

One additional optimization that may be performed is to perform global communication/synchronization only if needed. For example, given a select operation and if one of the input layers is globally empty, then the optimization would treat it as a local operation and skip the global communication/synchronization phase.

What has been disclosed above is an improved method, system, and computer program product for utilizing window-based parallelism, in which the invention enables a PV tool to efficiently generate the accurate result for geometrical select operations. This is a complete solution which ensures the accurate result for geometrical select operations in a DP-based PV tool.

System Architecture Overview

Figure 14:
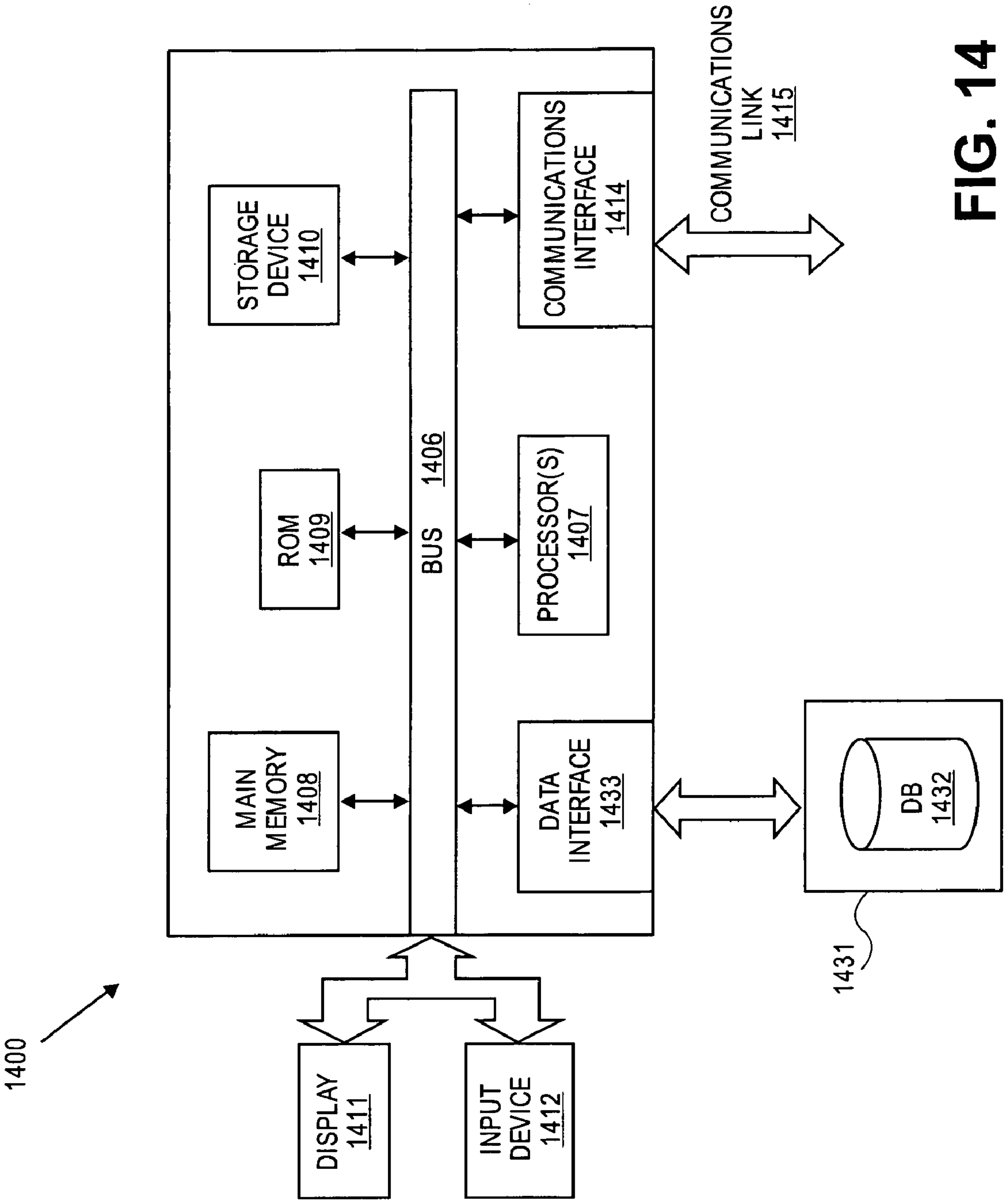
FIG. 14 illustrates an example computing architecture with which the invention may be implemented.

FIG. 14 is a block diagram of an illustrative computing system 1400 suitable for implementing an embodiment of the present invention. Computer system 1400 includes a bus 1406 or other communication mechanism for communicating information, which interconnects subsystems and devices, such as processor 1407, system memory 1408 (e.g., RAM), static storage device 1409 (e.g., ROM), disk drive 1410 (e.g., magnetic or optical), communication interface 1414 (e.g., modem or ethernet card), display 1411 (e.g., CRT or LCD), input device 1412 (e.g., keyboard), and cursor control.

According to one embodiment of the invention, computer system 1400 performs specific operations by processor 1407 executing one or more sequences of one or more instructions contained in system memory 1408. Such instructions may be read into system memory 1408 from another computer readable/usable medium, such as static storage device 1409 or disk drive 1410. In alternative embodiments, hard-wired circuitry may be used in place of or in combination with software instructions to implement the invention. Thus, embodiments of the invention are not limited to any specific combination of hardware circuitry and/or software. In one embodiment, the term "logic" shall mean any combination of software or hardware that is used to implement all or part of the invention.

The term "computer readable medium" or "computer usable medium" as used herein refers to any medium that participates in providing instructions to processor 1407 for execution. Such a medium may take many forms, including but not limited to, non-volatile media and volatile media. Non-volatile media includes, for example, optical or magnetic disks, such as disk drive 1410. Volatile media includes dynamic memory, such as system memory 1408.

Common forms of computer readable media includes, for example, floppy disk, flexible disk, hard disk, magnetic tape, any other magnetic medium, CD-ROM, any other optical medium, punch cards, paper tape, any other physical medium with patterns of holes, RAM, PROM, EPROM, FLASH-EPROM, any other memory chip or cartridge, or any other medium from which a computer can read.

In an embodiment of the invention, execution of the sequences of instructions to practice the invention is performed by a single computer system 1400. According to other embodiments of the invention, two or more computer systems 1400 coupled by communication link 1415 (e.g., LAN, PTSN, or wireless network) may perform the sequence of instructions required to practice the invention in coordination with one another.

Computer system 1400 may transmit and receive messages, data, and instructions, including program, i.e., application code, through communication link 1415 and communication interface 1414. Received program code may be executed by processor 1407 as it is received, and/or stored in disk drive 1410, or other non-volatile storage for later execution.

In the foregoing specification, the invention has been described with reference to specific embodiments thereof. It will, however, be evident that various modifications and changes may be made thereto without departing from the broader spirit and scope of the invention. For example, the above-described process flows are described with reference to a particular ordering of process actions. However, the ordering of many of the described process actions may be changed without affecting the scope or operation of the invention. The specification and drawings are, accordingly, to be regarded in an illustrative rather than restrictive sense.

The invention claimed is:

1. A computer-implemented method for multi-processing of an electronic design layout, comprising:

dividing by a processor the electronic design layout into multiple layout portions to be processed by multiple processing entities, wherein the multiple layout portions comprise a first layout portion and a second layout portion such that the first layout portion and the second layout portion are processed in parallel by a respective first processing entity and a respective second processing entity of the multiple processing entities;

identifying a geometric operation to be performed upon the electronic design layout;

processing internal shapes within the layout portions;

processing interface shapes, wherein the processing interface shapes comprises:

performing local regioning for the geometric operation upon one or more of the layout portions, wherein the performing local regioning comprises accessing data information from neighboring layout portions;

performing global regioning for the geometric operation upon the multiple layout portions, wherein the performing global regioning comprises aggregating results of local regioning from across the multiple layout portions;

combining results of processing the internal shapes and the interface shapes; and storing the combined results in a volatile or non-volatile computer readable medium or displaying the combined results on a display device.

2. The method of claim 1 in which the electronic design layout is divided into multiple windows.

3. The method of claim 1 in which the geometric operation comprises a geometrical select operation.

4. The method of claim 3 in which the geometrical select operation is selected from the group consisting of polygon inside operation, polygon outside operation, polygon cut operation, polygon touch operation, polygon interact operation, polygon enclose operation.

5. The method of claim 3 in which the geometrical select operation comprises a binary select operation or a count-based select operation.

6. The method of claim 1 further comprising performing flag aggregation.

7. The method of claim 1 further comprising distributed regioning on multiple layers in a first pass and count aggregation in a second pass.

8. The method of claim 1 in which the internal shapes comprise polygons whose global results are not affected by external layout portions.

9. The method of claim 1 in which the interface shapes comprise polygons whose global results are affected by external layout portions.

10. The method of claim 1 further comprising:

determining whether the geometric operation is a binary operation or a count-based operation.

11. The method of claim 10 in which count aggregation is performed for the count-based operation.

12. The method of claim 1 in which regioning comprises:

forming a local regioning graph; and computing a global regioning graph.

13. The method of claim 1 in which local regioning is performed by grouping interface shapes, identifying neighboring interface shapes, and building local region pairs.

14. The method of claim 1 in which global regioning is performed by computing a local disjoint graph for each layout portion, performing graph aggregation, and determining a global regioning result.

15. The method of claim 1 in which aggregation is not performed for global regioning for a layout portion if the layout portion does not include relevant information.

16. The method of claim 1 in which aggregation or updating of a layout portion is performed only if the layout portion includes relevant information.

17. The method of claim 1 in which multiple geometric operations are grouped together and combined communications is used for the multiple geometric operations.

18. The method of claim 1 in which global communication is not performed between layout portions if not needed.

19. The method of claim 18 in which an input layer is globally empty.

20. The method of claim 1, wherein each window is an area of the electronic design layout that contains one or more internal and/or interface shapes.

21. A system comprising a plurality of processors for multi-processing of an electronic design layout, comprising:

a processor for dividing the electronic design layout into multiple layout portions to be processed by multiple processing entities, wherein the multiple layout portions comprise a first layout portion and a second layout portion such that the first layout portion and the second layout portion are processed in parallel by a respective first processing entity and a respective second processing entity of the multiple processing entities;

means for identifying a geometric operation to be performed upon the electronic design layout;

means for processing internal shapes within the layout portions;

means for processing interface shapes, wherein the means for processing interface shapes comprises:

means for performing local regioning for the geometric operation upon one or more of the layout portions, wherein the performing local regioning comprises accessing data information from neighboring, layout portions;

means for performing global regioning for the geometric operation upon the multiple layout portions, wherein the performing global regioning comprises aggregating results of local regioning from across the multiple layout portions;

means for combining results of processing the internal shapes and the interface shapes; and a volatile or non-volatile computer readable medium for storing the combined results or a display device for displaying the combined results.

22. The system of claim 21 further comprising means for distributed regioning on multiple layers in a first pass and count aggregation in a second pass.

23. The system of claim 21 in which the geometrical operation comprises a binary select operation or a count-based select operation.

24. The system of claim 21, wherein each window is an area of the electronic design layout that contains one or more internal and/or interface shapes.

25. A computer program product comprising computer readable storage medium having executable code stored thereon for executing a process by a plurality of processors for multi-processing of an electronic design layout, the process comprising:

dividing the electronic design layout into multiple layout portions to be processed by multiple processing entities, wherein the multiple layout portions comprise a first layout portion and a second layout portion such that the first layout portion and the second layout portion are processed in parallel by a respective first processing entity and a respective second processing entity of the multiple processing entities;

identifying a geometric operation to be performed upon the electronic design layout;

processing internal shapes within the layout portions;

processing interface shapes, wherein the processing interface shapes comprises:

performing local regioning for the geometric operation upon one or more of the layout portions, wherein the performing local regioning comprises accessing data information from neighboring layout portions; and performing global regioning for the geometric operation upon the multiple layout portions, wherein the performing global regioning comprises aggregating results of local regioning, from across the multiple layout portions;

combining results of processing the internal shapes and the interface shapes; and storing the combined results or displaying the combined results on a display device.

26. The computer program product of claim 25, wherein the process further comprising distributed regioning on multiple layers in a first pass and count aggregation in a second pass.

27. The computer program product of claim 25 in which the geometrical operation comprises a binary select operation or a count-based select operation.

28. The computer program product of claim 25, wherein each window is an area of the electronic design layout that contains one or more internal and/or interface shapes.

* * * * *